US011294523B2

(12) United States Patent
Wang et al.

(10) Patent No.: US 11,294,523 B2
(45) Date of Patent: Apr. 5, 2022

(54) TOUCH STRUCTURE, TOUCH SUBSTRATE AND TOUCH DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yangpeng Wang, Beijing (CN); Weinan Dai, Beijing (CN); Xucong Wang, Beijing (CN); Xianghua Nan, Beijing (CN); Yuanyuan Chai, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/059,514

(22) PCT Filed: Mar. 12, 2020

(86) PCT No.: PCT/CN2020/078977
§ 371 (c)(1),
(2) Date: Nov. 30, 2020

(87) PCT Pub. No.: WO2020/199891
PCT Pub. Date: Oct. 8, 2020

(65) Prior Publication Data
US 2021/0208736 A1    Jul. 8, 2021

(30) Foreign Application Priority Data
Apr. 2, 2019  (CN) .......................... 201920443523.1

(51) Int. Cl.
*G06F 3/044* (2006.01)
*G06F 3/041* (2006.01)
*H01L 27/32* (2006.01)

(52) U.S. Cl.
CPC .......... *G06F 3/0446* (2019.05); *G06F 3/0445* (2019.05); *G06F 3/0412* (2013.01); *G06F 2203/04102* (2013.01); *H01L 27/323* (2013.01)

(58) Field of Classification Search
CPC .... G06F 3/0446; G06F 3/0445; G06F 3/0412; G06F 2203/04102; G06F 2203/04105; G06F 3/041; H01L 27/323
See application file for complete search history.

(56) References Cited

U.S. PATENT DOCUMENTS

2015/0293629 A1   10/2015  Ryu et al.
2016/0282993 A1*  9/2016   Song .................... G06F 3/0446
(Continued)

FOREIGN PATENT DOCUMENTS

| CN | 108958539 | 12/2018 |
| CN | 109508117 | 3/2019 |

(Continued)

OTHER PUBLICATIONS

PCT International Search Report (w/ English translation) for corresponding PCT Application No. PCT/CN2020/078977, dated Jun. 11, 2020—7 pages.

*Primary Examiner* — Md Saiful A Siddiqui
(74) *Attorney, Agent, or Firm* — Dority & Manning, P.A.

(57) ABSTRACT

A touch structure has a bending area and a non-bending area, and the bending area has a first center line parallel to a first direction. The touch structure includes: a plurality of first touch electrodes extending in the first direction and sequentially arranged in a second direction, and a first insulating layer. At least a portion of a first touch electrode located in the bending area includes first sub-touch electrodes; and the (Continued)

first direction intersects with the second direction. The first insulating layer has a plurality of via holes. Among the first sub-touch electrodes included in the first touch electrode, any two adjacent first sub-touch electrodes are located on two opposite sides of the first insulating layer, and any two adjacent first sub-touch electrodes are electrically connected through at least one via hole in the first insulating layer.

18 Claims, 13 Drawing Sheets

(56) References Cited

U.S. PATENT DOCUMENTS

| | | | |
|---|---|---|---|
| 2017/0255321 A1* | 9/2017 | Ding | G06F 3/0412 |
| 2018/0120615 A1 | 5/2018 | Wang et al. | |
| 2019/0165048 A1* | 5/2019 | Kim | H01L 27/3246 |
| 2020/0218385 A1* | 7/2020 | Feng | G06F 3/0443 |
| 2020/0333918 A1 | 10/2020 | Lin et al. | |

FOREIGN PATENT DOCUMENTS

| | | |
|---|---|---|
| CN | 109508118 | 3/2019 |
| CN | 209417707 | 9/2019 |
| CN | 110377180 | 10/2019 |

* cited by examiner

TOUCH STRUCTURE, TOUCH SUBSTRATE AND TOUCH DISPLAY APPARATUS

CROSS-REFERENCE TO RELATED APPLICATIONS

This application is a national phase entry under 35 USC 371 of International Patent Application No. PCT/CN2020/078977 filed on Mar. 12, 2020, which claims priority to Chinese Patent Application No. 201920443523.1, filed on Apr. 2, 2019, titled "A TOUCH STRUCTURE AND TOUCH DISPLAY APPARATUS", which are incorporated herein by reference in their entirety.

TECHNICAL FIELD

The present disclosure relates to the field of touch technologies, and in particular, to a touch structure, a touch substrate and a touch display apparatus.

BACKGROUND

With the development of flexible organic light-emitting diode (OLED) technologies, various types of flexible display apparatuses have emerged, such as foldable mobile phones, curtain-like televisions, or mobile phone-computer two-in-one products.

SUMMARY

In one aspect, the present disclosure provides a touch structure. The touch structure has a bending area and a non-bending area. The touch structure includes: a plurality of first touch electrodes extending in a first direction and sequentially arranged in a second direction, and a first insulating layer. At least a portion of a first touch electrode located in the bending area includes first sub-touch electrodes arranged in the first direction; the first direction intersects with the second direction; and the bending area has a first center line parallel to the second direction. The first insulating layer is provided with a plurality of via holes. Among the first sub-touch electrodes included in the first touch electrode, any two adjacent first sub-touch electrodes are located on two opposite sides of the first insulating layer, and any two adjacent first sub-touch electrodes are electrically connected through at least one via hole in the first insulating layer.

In some embodiments, a portion of the first touch electrode located in the non-bending area includes first sub-touch electrodes; and in the first direction, among the first sub-touch electrodes located in the non-bending area of the first touch electrode, any two adjacent first sub-touch electrodes are located on two opposite sides of the first insulating layer, and any two adjacent first sub-touch electrodes are electrically connected through at least one via hole in the first insulating layer.

In some embodiments, a portion of the first touch electrode located in the non-bending area extends continuously in the first direction, and portions of the plurality of first touch electrodes located in the non-bending area are disposed on a same side of the first insulating layer.

In some embodiments, there is a first dividing line parallel to the second direction between the bending area and the non-bending area. Lengths of the first sub-touch electrodes located in the bending area gradually decrease in a direction toward the first dividing line; or the lengths of the first sub-touch electrodes located in the bending area gradually decrease in a direction toward the first center line.

In some embodiments, there is a first dividing line parallel to the second direction between the bending area and the non-bending area. In an area defined by the first dividing line and the first center line, lengths of first sub-touch electrodes gradually decrease from middle to edges in a direction perpendicular to the first center line; and/or in an area on a side of the first center line away from the first dividing line, lengths of first sub-touch electrodes gradually decrease in a direction toward the first center line.

In some embodiments, lengths of the first sub-touch electrodes are in a range from 3 μm to 7500 μm in the first direction.

In some embodiments, the touch structure further includes a plurality of second touch electrodes extending in the second direction and sequentially arranged in the first direction. The first touch electrodes and the second touch electrodes are insulated from each other.

In some embodiments, the bending area further has a second center line parallel to the first direction; at least a portion of a second touch electrode located in the bending area includes second sub-touch electrodes arranged in the second direction. The touch structure further includes a second insulating layer having a plurality of via holes; and among the second sub-touch electrodes included in the second touch electrode, any two adjacent second sub-touch electrodes are located on two opposite sides of the second insulating layer, and any two adjacent second sub-touch electrodes are electrically connected through at least one via hole in the second insulating layer.

In some embodiments, a portion of the second touch electrode located in the non-bending area includes second sub-touch electrodes; and in the second direction, among the second sub-touch electrodes located in the non-bending area of the second touch electrode, any two adjacent second sub-touch electrodes are located on two opposite sides of the second insulating layer, and any two adjacent second sub-touch electrodes are electrically connected through at least one via hole in the second insulating layer.

In some embodiments, a portion of the second touch electrode located in the non-bending area extends continuously in the second direction, and portions of the plurality of second touch electrodes located in the non-bending area are disposed on a same side of the second insulating layer.

In some embodiments, there is a second dividing line parallel to the first direction between the bending area and the non-bending area. Lengths of the second sub-touch electrode located in the bending area gradually decrease in a direction toward the second dividing line; or the lengths of the second sub-touch electrode located in the bending area gradually decrease in a direction toward the second center line.

In some embodiments, there is a second dividing line parallel to the first direction between the bending area and the non-bending area. In an area defined by the second dividing line and the second center line, lengths of second sub-touch electrodes gradually decrease from middle to edges in a direction perpendicular to the second center line; and/or in an area on a side of the second center line away from the second dividing line, lengths of the second sub-touch electrodes gradually decrease in a direction toward the second center line.

In some embodiments, the lengths of the second sub-touch electrodes are in a range from 3 μm to 7500 μm in the second direction.

In some embodiments, the first insulating layer and the second insulating layer are a same film layer.

In some embodiments, the first sub-touch electrodes and the second sub-touch electrodes that are located on the same side of the first insulating layer are made of a same material and disposed in a same layer.

In some embodiments, the first insulating layer and the second insulating layer are sequentially arranged.

In some embodiments, first sub-touch electrodes and second sub-touch electrodes that are located between the first insulating layer and the second insulating layer are made of a same material and disposed in a same layer; or the touch structure further includes a third insulating layer disposed between the first insulating layer and the second insulating layer; and the plurality of first touch electrodes and the plurality of second touch electrodes are located on two opposite sides of the third insulating layer.

In some embodiments, the second touch electrode extends continuously in the second direction; and the plurality of second touch electrodes are disposed on a same side of the first insulating layer, or the plurality of second touch electrodes are disposed on two opposite sides of the first insulating layer.

In another aspect, the present disclosure further provides a touch substrate including a substrate and the touch structure as described in any of the above embodiments disposed on the substrate.

In yet another aspect, the present disclosure further provides a touch display apparatus including the touch structure as described in any of the above embodiments.

BRIEF DESCRIPTION OF THE DRAWINGS

In order to describe technical solutions in the present disclosure more clearly, accompanying drawings to be used in some embodiments of the present disclosure will be introduced below briefly. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on actual sizes of products, actual processes of methods and actual timings of signals to which the embodiments of the present disclosure relate.

FIG. 4b is a cross-sectional view along the AA line in FIG. 4a;

FIG. 6b is a cross-sectional view along the BB line in FIG. 6a;

FIG. 10b is a cross-sectional view along the CC line in FIG. 10a;

FIG. 11b is a cross-sectional view along the DD line in FIG. 11a;

FIG. 17b is a cross-sectional view along the EE line in FIG. 17a;

FIG. 19b is a cross-sectional view along the FF line in FIG. 19a;

FIG. 22b is a cross-sectional view along the GG line in FIG. 22a; and

DETAILED DESCRIPTION

Figure 1A:
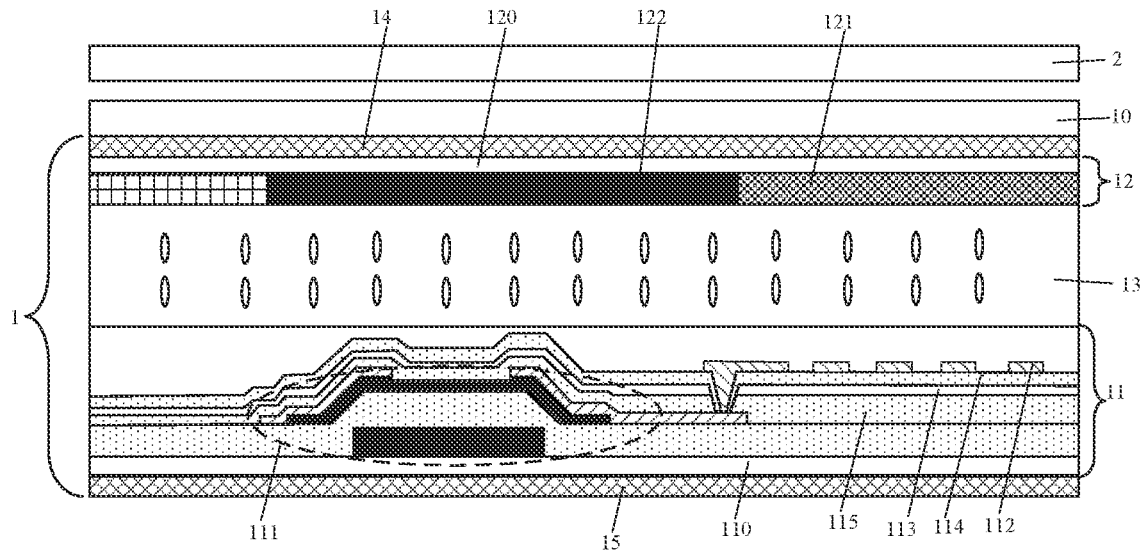
FIG. 1a is a structural diagram of a liquid crystal display apparatus, in accordance with some embodiments of the present disclosure.

Technical solutions in some embodiments of the present disclosure will be described clearly and completely in combination with accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, the term "comprise" and other forms thereof such as the third-person singular form "comprises" and the present participle form "comprising" in the description and the claims are construed as open and inclusive, i.e., "including, but not limited to". In the description of the specification, terms such as "one embodiment", "some embodiments", "exemplary embodiments", "example", "specific example", or "some examples" are intended to indicate that specific features, structures, materials or characteristics related to the embodiment(s) or example(s) are included in at least one embodiment or example of the present disclosure. Schematic representations of the above terms do not necessarily refer to same embodiment(s) or example(s). In addition, specific features, structures, materials or characteristics may be included in any one or more embodiments or examples in any suitable manner.

Hereinafter, terms such as "first" and "second" are only used for descriptive purposes, and are not to be construed as indicating or implying the relative importance or implicitly indicating the number of indicated technical features below. Thus, features defined as "first" and "second" may explicitly or implicitly include one or more of the features. In the description of the embodiments of the present disclosure, terms "a plurality of" and "the plurality of" each mean two or more unless otherwise specified.

In the description of some embodiments, orientations or positional relationships indicated by terms "center", "upper", "lower", "front", "rear", "left", "right", "vertical", "horizontal", "top", "bottom", "inner", "outer" and the like are based on orientations or positional relationships shown in the drawings, which is merely to facilitate and simplify the description of the present disclosure, and is not to indicate or imply that the referred devices or elements must have a particular orientation, or must be constructed or operated in a particular orientation. Therefore, they will not be interpreted as limitations to the present disclosure.

In the description of some embodiments, terms such as "coupled" and "connected" and their derivatives may be used. For example, the term "connected" may be used in the description of some embodiments to indicate that two or more components s are in direct physical contact or electrical contact with each other. For another example, the term "coupled" may be used in the description of some embodiments to indicate that two or more components are in direct physical or electrical contact. The term "coupled" or "communicatively coupled", however, may also mean that two or more elements are not in direct contact with each other, but yet still cooperate or interact with each other. The embodiments disclosed herein are not necessarily limited to the content herein.

"At least one of A, B, and C" has a same meaning as "at least one of A, B, or C", and they both include the following combinations of A, B, and C: only A, only B, only C, a combination of A and B, a combination of A and C, a combination of B and C, and a combination of A, B, and C.

The phrase "A and/or B" includes the following three combinations: only A, only B, and a combination of A and B.

In some cases, embodiments involving "row direction" may be implemented in the case of "column direction", and vice versa. It is also within the scope of the claims to be protected by the present disclosure to rotate the solution of the present disclosure by 90° or mirror the solution of the present disclosure.

Embodiments of the present disclosure provide a touch display apparatus. The touch display apparatus may be a liquid crystal display (LCD) apparatus. The touch display apparatus may also be an electroluminescent display apparatus or a photoluminescent display apparatus.

In a case where the touch display apparatus is the electroluminescent display apparatus, the electroluminescent display apparatus may be an organic light-emitting diode (OLED) display apparatus or a quantum dot light-emitting diode (QLED) display apparatus. In a case where the touch display apparatus is the photoluminescent display apparatus, the photoluminescent display apparatus may be a quantum dot photoluminescent display apparatus.

Figure 1B:
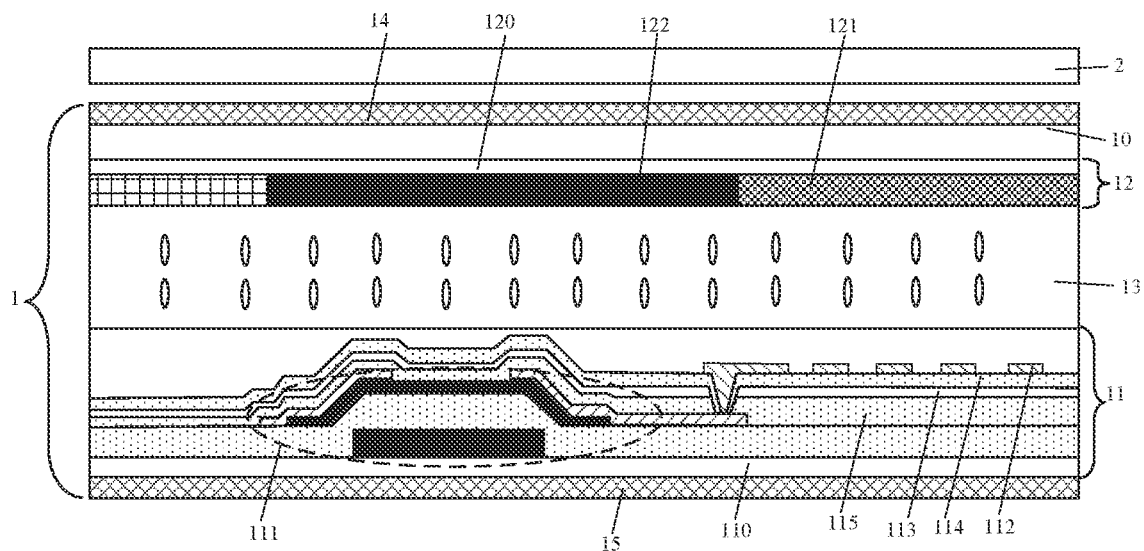
FIG. 1b is a structural diagram of another liquid crystal display apparatus, in accordance with some embodiments of the present disclosure.
Figure 1C:
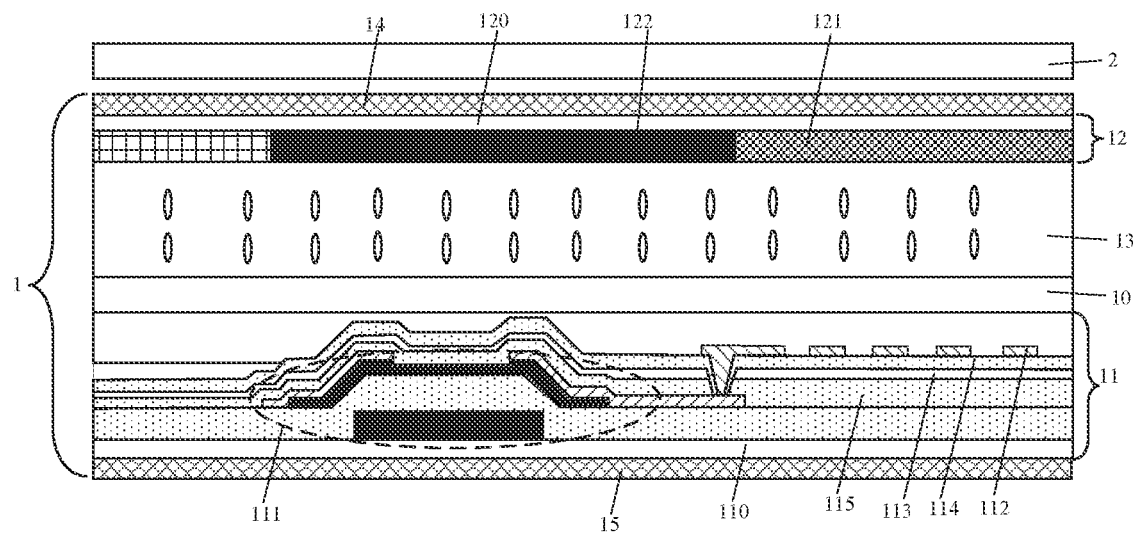
FIG. 1c is a structural diagram of yet another liquid crystal display apparatus, in accordance with some embodiments of the present disclosure.

In a case where the touch display apparatus is the liquid crystal display apparatus, as shown in FIGS. 1a, 1b and 1c, the touch display apparatus includes a cover glass 2, a touch structure 10, a liquid crystal display panel 1 and a backlight module. The backlight module is used to provide light for the liquid crystal display panel 1. The liquid crystal display panel 1 includes an array substrate 11, an opposite substrate 12, and a liquid crystal layer 13 between the array substrate 11 and the opposite substrate 12.

In some embodiments, as shown in FIGS. 1a, 1b and 1c, the array substrate 11 includes a first base 110 and a plurality of sub-pixels disposed on the first base 110. Each of the plurality of sub-pixels includes a thin film transistor 111 and a pixel electrode 112. The thin film transistor 111 includes an active layer, a source, a drain, a gate and a portion of a gate insulating layer, and the source and the drain are in contact with the active layer. The pixel electrode 112 is electrically connected to the drain of the thin film transistor 111.

In some embodiments, the array substrate 11 further includes a common electrode 113 disposed above the first base 110. The pixel electrode 112 and the common electrode 113 may be disposed in a same layer, or may be disposed in different layers.

In a case where the pixel electrode 112 and the common electrode 113 are disposed in the same layer, the pixel electrode 112 and the common electrode 113 each have a comb-tooth structure including a plurality of strip-shaped sub-electrodes.

In a case where the pixel electrode 112 and the common electrode 113 are disposed in different layers, as shown in FIGS. 1a, 1b and 1c, a fifth insulating layer 114 is provided between the pixel electrode 112 and the common electrode 113. For example, the common electrode 113 is disposed between a layer where the source and the drain of the thin film transistor 111 are located (i.e., a source-drain electrode layer) and the pixel electrode 112. It can be understood that, in a case where the common electrode 113 is disposed between the source-drain electrode layer and the pixel electrode 112, a fourth insulating layer 115 is provided between the common electrode 113 and the source-drain electrode layer.

In some embodiments, the opposite substrate 12 includes the common electrode 113, that is, the common electrode 113 is disposed in the opposite substrate 12. The embodiments of the present disclosure are illustrated by taking the array substrate 11 including the common electrode 113 as an example.

The thin film transistor 111 in the embodiments of the present disclosure may be a bottom-gate thin film transistor or a top-gate thin film transistor. The figures in the embodiments of the present disclosure are illustrated by taking the thin film transistor 111 being the bottom-gate thin film transistor as an example.

As shown in FIGS. 1a, 1b and 1c, the opposite substrate 12 includes a second base 120 and a color filter layer 121 disposed on the second base 120. In this case, the opposite substrate 12 may also be referred to as a color filter (CF) substrate. The color filter layer 121 includes at least a plurality of red photoresist units, a plurality of green photoresist units, and a plurality of blue photoresist units. The plurality of red photoresist units, the plurality of green photoresist units, and the plurality of blue photoresist units and the plurality of sub-pixels in the array substrate 11 are directly opposite in a one-to-one correspondence. The opposite substrate 12 further includes a black matrix pattern 122 disposed on the second base 120, and the black matrix pattern 122 is used to space the plurality of red photoresist units, the plurality of green photoresist units, and the plurality of blue photoresist units apart.

As shown in FIGS. 1a, 1b and 1c, the liquid crystal display panel 1 further includes an upper polarizer 14 disposed on a side of the opposite substrate 12 away from the liquid crystal layer 13, and a lower polarizer 15 disposed on a side of the array substrate 11 away from the liquid crystal layer 13.

In some embodiments, as shown in FIG. 1a, the touch structure 10 is disposed outside the liquid crystal display panel 1, i.e., disposed between the cover glass 2 and the upper polarizer 14. In this case, the touch display apparatus is referred to as an out-cell touch display apparatus.

In some other embodiments, as shown in FIGS. 1b and 1c, the touch structure 10 is disposed in the liquid crystal display panel 1. As shown in FIG. 1b, the touch structure 10 may be disposed between the upper polarizer 14 and the opposite substrate 12. In this case, the touch display apparatus is referred to as an on-cell touch display apparatus. Or, as shown in FIG. 1c, the touch structure 10 is disposed between the first base 110 and the second base 120, e.g., disposed above the first base 110. In this case, the touch display apparatus is referred to as an in-cell touch display apparatus.

Figure 2A:
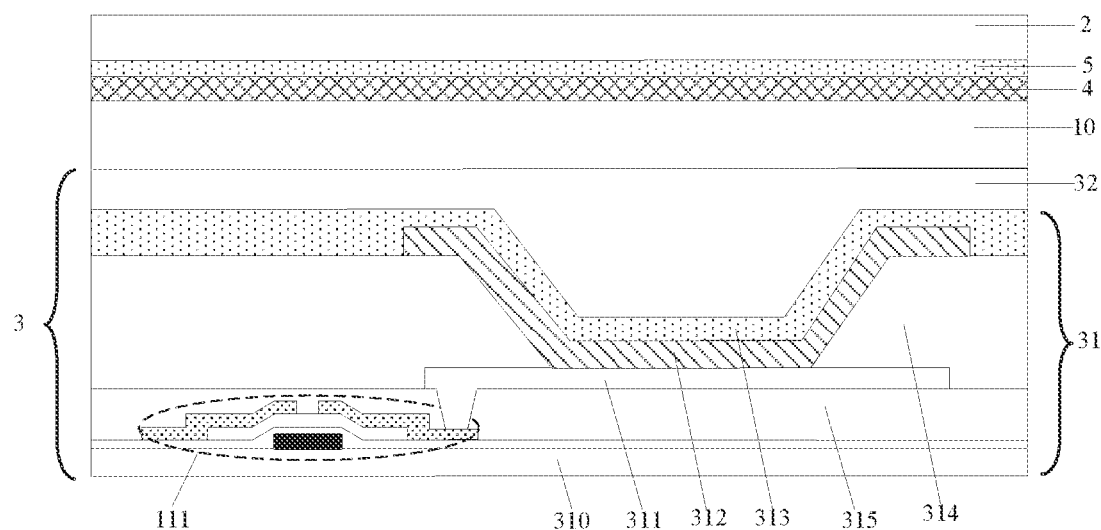
FIG. 2a is a structural diagram of an electroluminescent display apparatus or a photoluminescent display apparatus, in accordance with some embodiments of the present disclosure.
Figure 2B:
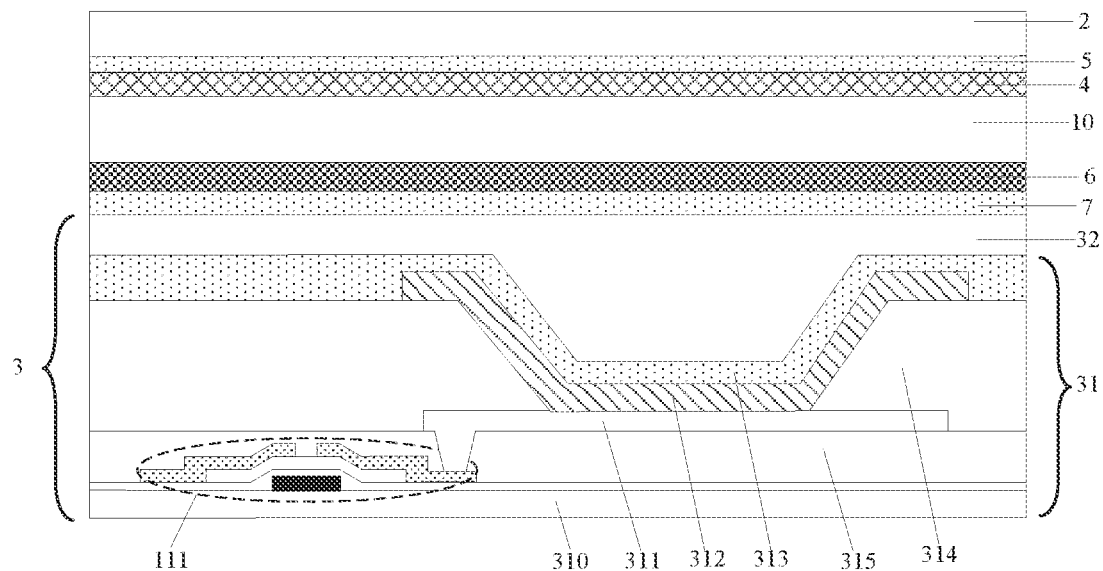
FIG. 2b is a structural diagram of another electroluminescent display apparatus or another photoluminescent display apparatus, in accordance with some embodiments of the present disclosure.

In a case where the touch display apparatus is the electroluminescent display apparatus or the photoluminescent display apparatus, as shown in FIGS. 2a and 2b, the electroluminescent display apparatus (or the photoluminescent display apparatus) includes an electroluminescent display panel 3 (or a photoluminescent display panel 3), a touch structure 10, a polarizer 4, a first optically clear adhesive (OCA) 5 and a cover glass 2 that are sequentially arranged.

The electroluminescent display panel 3 (or the photoluminescent display panel 3) includes a display substrate 31 and an encapsulation layer 32 for encapsulating the display substrate 31. Herein, the encapsulation layer 32 may be an encapsulation film or an encapsulation substrate.

As shown in FIGS. 2a and 2b, the display substrate 31 includes a plurality of sub-pixels, each sub-pixel includes a light-emitting device and a driving circuit that are disposed on a third base 310, and the driving circuit includes a plurality of thin film transistors 111. The light-emitting device includes an anode 311, a light-emitting functional layer 312 and a cathode 313, and the anode 311 is electrically connected to a drain of a thin film transistor 111 that is used as a driving transistor among the plurality of thin film transistors 111, The display substrate 31 further includes a pixel defining layer 314, the pixel defining layer 314 includes a plurality of openings, and corresponding to an opening, the anode 311 is not disposed in the opening. In some embodiments, the light-emitting functional layer 312 includes a light-emitting layer. In some other embodiments, in addition to the light-emitting layer, the light-emitting functional layer 312 further includes one or more of an electron transporting layer (ETL), an electron injection layer (EIL), a hole transporting layer (HTL) and a hole injection layer (HIL).

As shown in FIG. 2a, the display substrate 31 further includes a planarization layer 315 disposed between the thin film transistors 111 and the anode 311.

In a case where the touch display apparatus is the electroluminescent display apparatus or the photoluminescent display apparatus, the touch display apparatus may be a top-emission display apparatus. In this case, the anode 311 proximate to the third base 310 is opaque, and the cathode 313 away from the third base 310 is transparent or translucent. The touch display apparatus may also be a bottom-emission display apparatus. In this case, the anode 311 proximate to the third base 310 is transparent or translucent, and the cathode 313 away from the third base 310 is opaque. The touch display apparatus may also be a double-sided emission display apparatus. In this case, the anode 311 proximate to the third base 310 and the cathode 313 away from the third base 310 are both transparent or translucent.

It can be understood that, in a case where the touch display apparatus is the electroluminescent display apparatus or the photoluminescent display apparatus, the touch display apparatus is easier to be manufactured as a flexible display apparatus.

In a case where the touch display apparatus is the electroluminescent display apparatus or the photoluminescent display apparatus, in some embodiments, as shown in FIG. 2a, the touch structure 10 is directly disposed on the encapsulation layer 32. That is, no other layer is provided between the touch structure 10 and the encapsulation layer 32. In a case where the touch structure 10 is directly disposed on the encapsulation layer 32, a thickness of the touch display apparatus is small, which is conducive to achieving lightness and thinness.

As shown in FIG. 2b, embodiments of the present disclosure also provide a touch substrate, and the touch substrate includes the touch structure 10 and a substrate 6. The touch structure 10 is disposed on the substrate 6.

In some embodiments, the substrate 6 is attached to the encapsulation layer 32 through a second OCA 7.

The substrate 6 may be made of, for example, polyethylene terephthalate (PET), polyimide (PI), cyclo olefin polymer (COP), etc.

Embodiments of the present disclosure provide a touch structure 10, which can be applied to the touch display apparatus. A position of the touch structure 10 in the touch display apparatus and other structures other than the touch structure 10 in the touch display apparatus have been described in detail above, which will not be repeated below.

Figure 3:
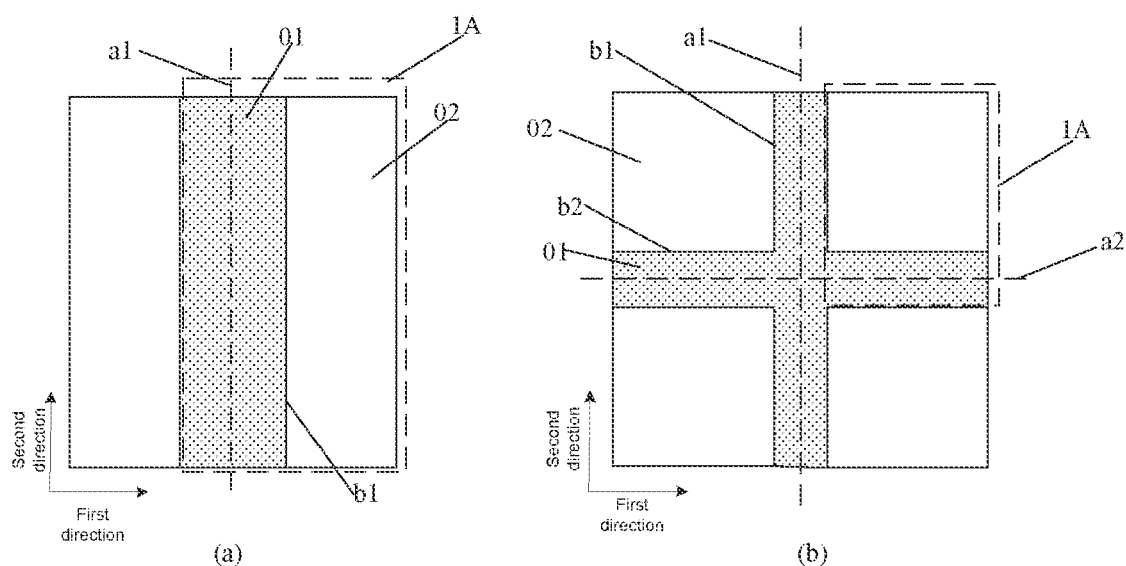
FIG. 3 is a layout diagram of a bending area and a non-bending area in two kinds of touch structures, in accordance with some embodiments of the present disclosure.

As shown in FIG. 3, the touch structure 10 provided by the embodiments of the present disclosure has bending area(s) 01 and non-bending area(s) 02.

The division of the touch structure 10 into the bending area(s) 01 and the non-bending area(s) 02 is made according to the bending area(s) 01 and the non-bending area(s) 02 in the touch display apparatus after the touch structure 10 is applied to the touch display apparatus.

In some embodiments, as shown in (a) of FIG. 3, the touch structure 10 includes one bending area 01 and two non-bending areas 02, and the two non-bending areas 02 are located on two sides of the bending area 01.

With continued reference to (a) of FIG. 3, the bending area 01 has a first center line a1 parallel to a second direction. In a case where the touch structure 10 is folded along the second direction, a straight line where the first center line a1 is located is a folding line of the bending area 01 and the non-bending areas 02. As shown in (a) of FIG. 3, the bending area 01 and the non-bending area 02 further have a first dividing line b1 therebetween parallel to the second direction. In a process of the touch structure 10 being bent along the second direction, i.e., in a process of the bending area 01 and the non-bending area 02 being bent along the first center line a1, a position where the first dividing line b1 is located is a starting position of bending.

In some embodiments, as shown in (b) of FIG. 3, the touch structure 10 includes one bending area 01 and four non-bending areas 02. The bending area 01 includes two parts, one part extends in the second direction, the other part extends in a first direction, and the first direction and the second direction intersect, e.g., are perpendicular to each other. That is, the two parts of the bending area 01 cross. In other words, the bending area 01 has a cross-shaped structure. An area other than the bending area 01 of the touch structure 10 is divided into four areas by the bending area 01, and the four non-bending areas 02 are disposed in the four areas, respectively.

With continued reference to (b) of FIG. 3, the bending area 01 has the first center line a1 parallel to the second direction. In a case where the touch structure 10 is folded along the second direction, the straight line where the first center line a1 is located is the folding line of the bending area 01 and the non-bending areas 02. As shown in (b) of FIG. 3, the bending area 01 and the non-bending area 02 further have the first dividing line b1 therebetween parallel to the second direction. In a process of the touch structure 10 being bent along the second direction, i.e., in a process of the bending area 01 and the non-bending area 02 being bent along the first center line a1, the position where the first dividing line b1 is located is the starting position of bending.

With continued reference to (b) of FIG. 3, the bending area 01 has a second center line a2 parallel to the first direction. In a case where the touch structure 10 is folded along the first direction, a straight line where the second center line a2 is located is a folding line of the bending area 01 and the non-bending area 02. As shown in (b) of FIG. 3, the bending area 01 and the non-bending area 02 further have a second dividing line b2 therebetween parallel to the first direction. In a process of the touch structure 10 being bent along the first direction, i.e., in a process of the bending area 01 and the non-bending area 02 being bent along the second center line a2, a position where the second dividing line b2 is located is a starting position of bending.

Of course, in the embodiments of present disclosure, an arrangement of the bending area 01 and the non-bending areas 02 may also be other forms. For example, the touch structure 10 has one bending area 01 and one non-bending area 02. For another example, the touch structure 10 has two bending areas 01 and one non-bending area 02, and the two bending areas 01 are located on two sides of the non-bending area 02. The embodiments of the present disclosure take the two arrangements of the bending area 01 and the non-bending areas 02 shown in (a) and (b) of FIG. 3 as examples for illustration.

Figure 4A:
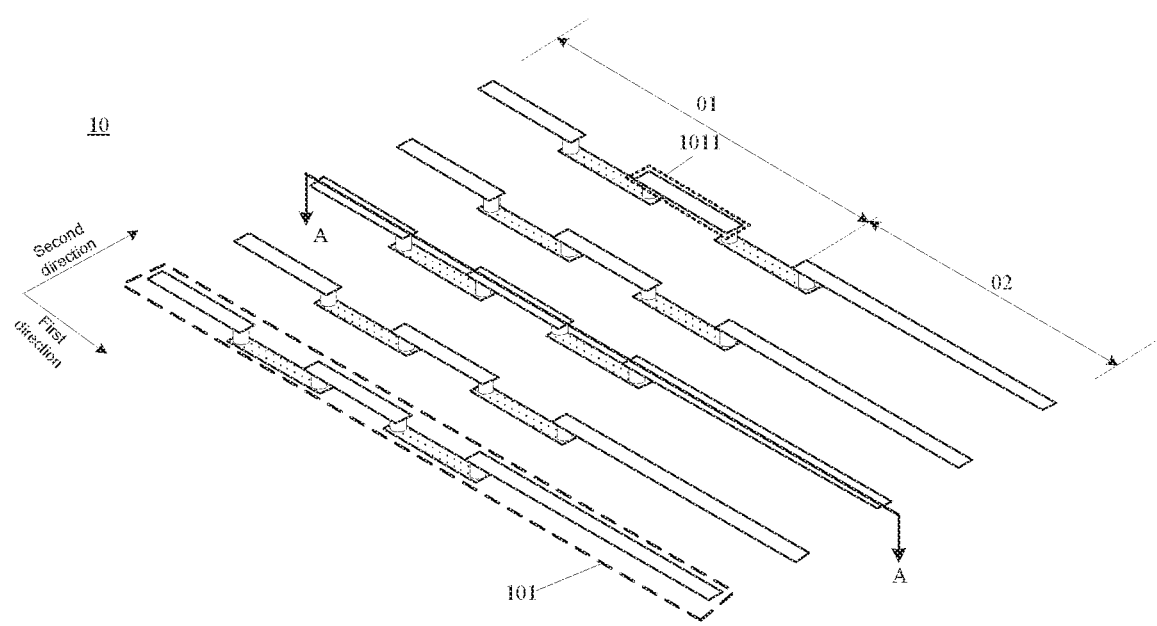
FIG. 4a is a structural diagram of a first touch electrode, in accordance with some embodiments of the present disclosure.
Figure 4B:
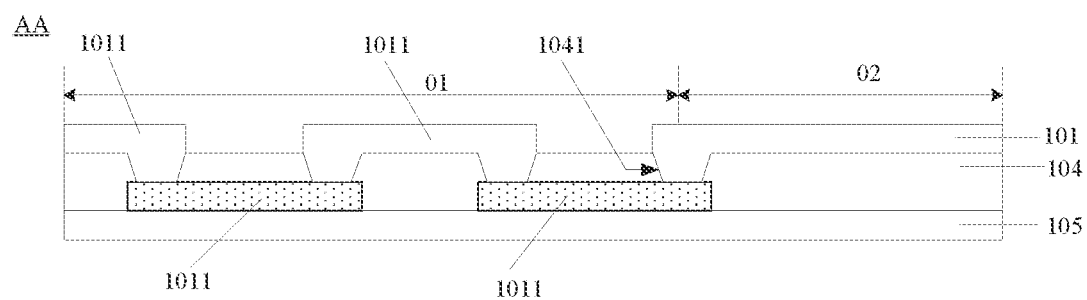

Referring to FIGS. 4a and 4b, the touch structure 10 includes a plurality of first touch electrodes 101 extending in the first direction and sequentially arranged in the second direction. At least a portion of a first touch electrode 101 located in the bending area 01 includes a plurality of first sub-touch electrodes 1011 arranged in or substantially in the first direction. The first direction intersects with the second direction.

That the first touch electrode 101 extends in the first direction means that the first touch electrode 101 has a tendency to extend in the first direction as a whole.

A shape of the first touch electrode 101 is not limited in the embodiments of the present disclosure. An overall shape of the first touch electrode 101 may be a straight strip or a bent strip. Of course, the first touch electrode 101 may also include a plurality of first rhombuses arranged sequentially in the first direction, and adjacent first rhombuses are connected together through a first connecting strip.

That the first direction intersects with the second direction means that there is an angle between the first direction and the second direction. For example, the first direction and the second direction are perpendicular to each other. For another example, the angle between the first direction and the second direction is an acute angle.

Referring to FIG. 4b, the touch structure 10 provided by the embodiments of the present disclosure further includes a first insulating layer 104. The first insulating layer 104 has a plurality of via holes 1041. Among the plurality of first sub-touch electrodes 1011 of the first touch electrode 101, two adjacent first sub-touch electrodes 1011 are located on two opposite sides of the first insulating layer 104, and the two adjacent first sub-touch electrodes 1011 are electrically connected through at least one via hole 1041 in the first insulating layer 104.

It will be noted that, in the text, the first insulating layer 104 is not shown in FIG. 4a and FIGS. 6a, 10a, 11a, 17a, and 19a appearing hereinafter. In the text, FIG. 4b and FIGS. 6b, 7, 8, 9, 10b, 11b, 12, 13, 14, 15, 16, 17b, 18, 19b, 20, and 21 appearing hereinafter are illustrated by taking the touch structure 10 being disposed on the substrate 105 as an example.

For example, as shown in FIG. 4a, in the first direction, among the plurality of first sub-touch electrodes 1011 included in the first touch electrode 101, the plurality of first sub-touch electrodes 1011 are alternately located on two opposite sides of the first insulating layer 104. For example, as shown in FIGS. 4a and 4b, the first touch electrode 101 includes four first sub-touch electrodes 1011, and the four first sub-touch electrodes 1011 are alternately located on two opposite sides of the first insulating layer 104.

In embodiments of the present disclosure, in the first direction, two adjacent first sub-touch electrodes 1011 respectively located on two opposite sides of the first insulating layer 104 may be made of a same material or different materials.

In embodiments of the present disclosure, a material of the first insulating layer 104 is not limited. For example, it may be one or more of SiOx, SiNx and SiNxOy.

Figure 5:
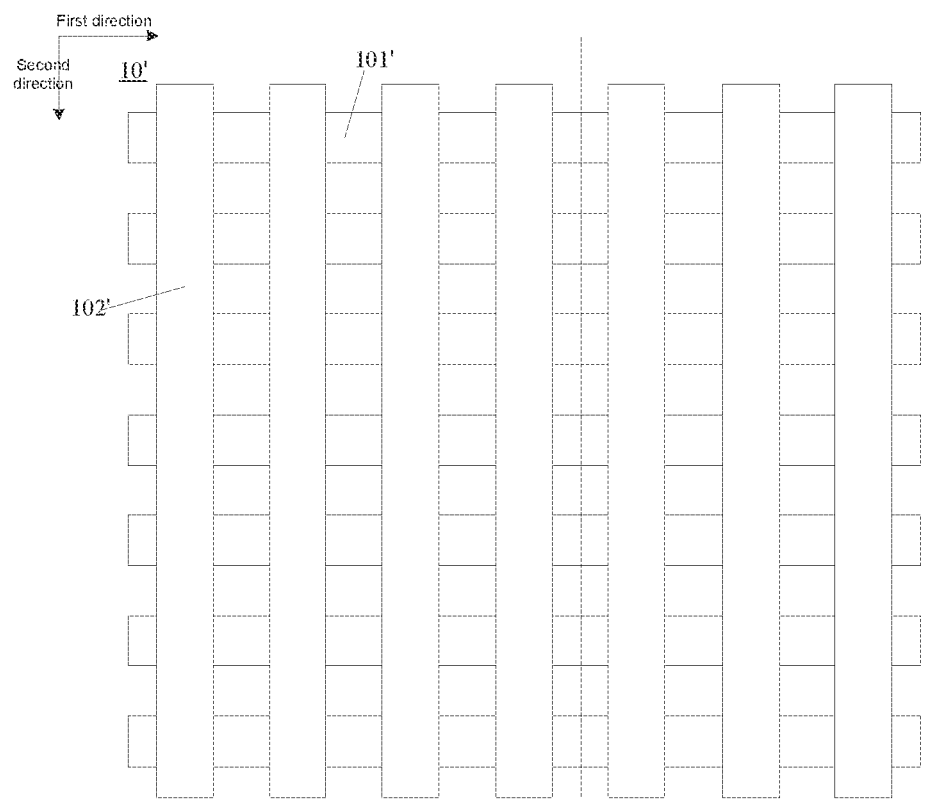
FIG. 5 is a structural diagram of a touch structure in the related art.

As shown in FIG. 5, in the related art, the touch structure 10' includes a plurality of first touch electrodes 101" extending in the first direction and sequentially arranged in the second direction. A shape of the first touch electrode 101' is a continuous strip. It can be understood that in a case where the touch structure 10' is bent along the second direction (i.e., the bending line is parallel to the second direction), for example, in a case where the touch structure 10' is bent along the dotted line shown in FIG. 5, since the shape of the first touch electrode 101" is a strip extending continuously in the first direction, and an extending direction of the first touch electrode 101' is perpendicular to a direction in which stress is applied during bending the touch structure 10', the first touch electrode 101' is prone to problems such as breakage, warpage, crease, or peeling off from the substrate in the bending process, thereby resulting in reduction of bending resistance of the touch structure 10'.

Relative to the related art, as shown in FIG. 4a, the embodiments of the present disclosure provide the touch structure 10, at least a portion of the first touch electrode 101 located in the bending area 01 includes a plurality of first sub-touch electrodes 1011. Among the plurality of first sub-touch electrodes 1011 included in the first touch electrode 101, any two adjacent first sub-touch electrodes 1011 are located on two opposite sides of the first insulating layer 104, and any two adjacent first sub-touch electrodes 1011 are electrically connected through at least one via hole in the first insulating layer 104. In a case where the touch structure 10 is bent along the second direction in the bending area 01 (i.e., the bending line is parallel to the second direction), since in the embodiments of the present disclosure, the plurality of first sub-touch electrodes 1011 extending in a first direction are alternately arranged on and below the first insulating layer 104 at least in the bending area 01, part of the stress may be released to reduce the stress impact caused by bending. In this way, the problems such as breakage, peeling off, warpage or crease caused by excessive stress or stress concentration after the first touch electrode 101 is repeatedly bent may be avoided in the embodiments of the present disclosure, which improves the bending resistance of the touch structure 10.

Referring to FIGS. 4a, 4b, 6a and 6b, in some embodiments, an arrangement of a portion of the first touch electrode 101 located in the non-bending area 02 includes but is not limited to the following two manners.

I. As shown in FIGS. 4a and 4b, the portion of the first touch electrode 101 located in the non-bending area 02 continuously extends in the first direction, and the portion of the first touch electrode 101 located in the non-bending area 02 is located on a same side of the first insulating layer 104. That is, only the portion of the first touch electrode 101 located in the bending area 01 includes the plurality of first sub-touch electrodes 1011, whereas the portion of the first touch electrode 101 located in the non-bending area 02 is entire.

Figure 6A:
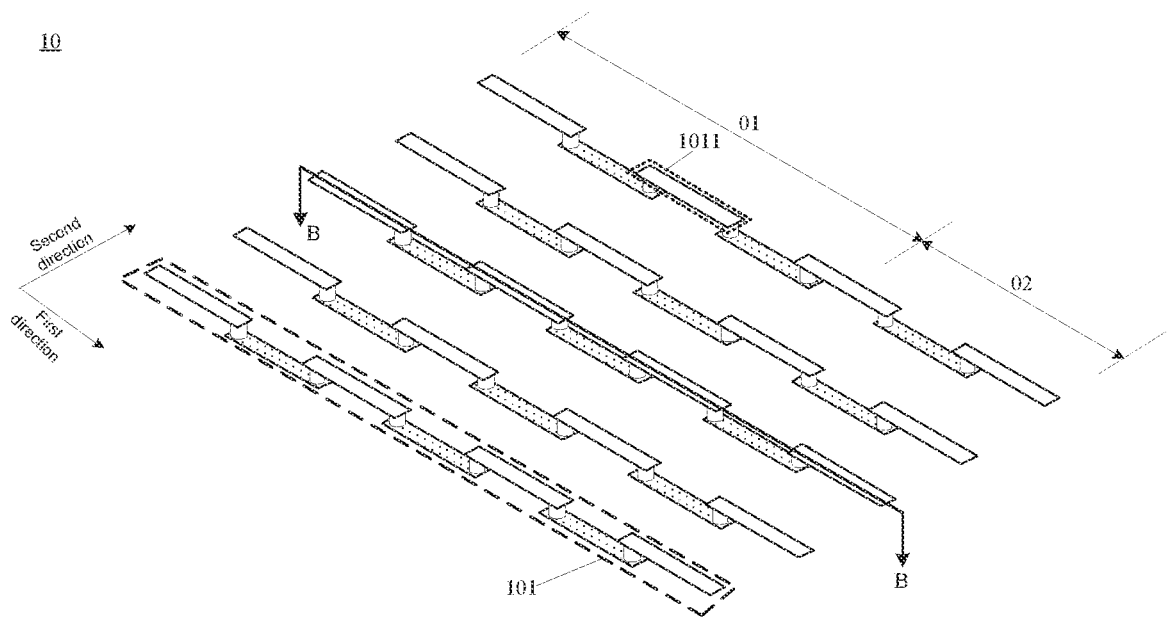
FIG. 6a is a structural diagram of another first touch electrode, in accordance with some embodiments of the present disclosure.
Figure 6B:
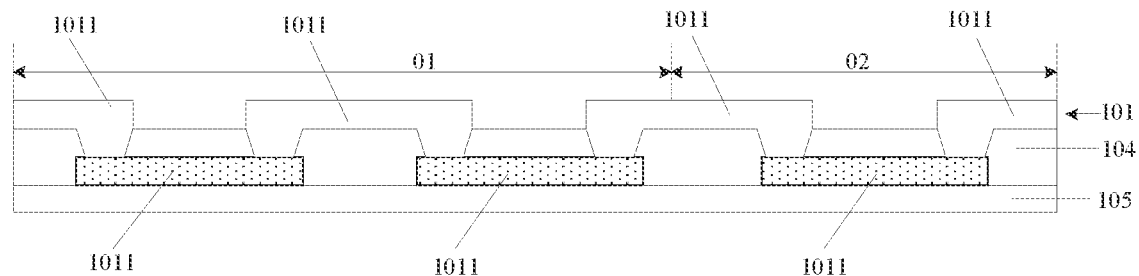

II. As shown in FIGS. 6a and 6b, the portion of the first touch electrode 101 located in the non-bending area 02 includes a plurality of first sub-touch electrodes 1011. In the first direction, among the plurality of first sub-touch electrodes 1011 of the first touch electrode 101 located in the non-bending area 02, any two adjacent first sub-touch electrodes 1011 are located on two opposite sides of the first insulating layer 104, and any two adjacent first sub-touch electrodes 1011 are electrically connected through at least one via hole 1041 in the first insulating layer 104. That is, the portion of the first touch electrode 101 located in the bending area 01 and the portion of the first touch electrode 101 located in the non-bending area 02 both include first sub-touch electrodes 1011.

In embodiments of the present disclosure, lengths of the plurality of first sub-touch electrodes 1011 included in the first touch electrode 101 may be the same or different.

For example, as shown in FIGS. 4a and 4b, in a case where only the portion of the first touch electrode 101 located in the bending area 01 includes the plurality of first sub-touch electrodes 1011, the lengths of the plurality of first sub-touch electrode 1011 located in the bending area 01 are the same. Or, in the case where only the portion of the first touch electrode 101 located in the bending area 01 includes the plurality of first sub-touch electrodes 1011, the lengths of the plurality of first sub-touch electrodes 1011 located in the bending area 01 are different.

For example, as shown in FIGS. 6a and 6b, in a case where the portions of the first touch electrode 101 located in the bending area 01 and in the non-bending area 02 both include the first sub-touch electrodes 1011, the lengths of the first sub-touch electrodes 1011 included in the first touch electrode 101 are the same. Or, in the case where the portions of the first touch electrode 101 located in the bending area 01 and in the non-bending area 02 both include the first sub-touch electrodes 1011, the lengths of the first sub-touch electrodes 1011 included in the first touch electrode 101 are different.

In some embodiments, the bending area 01 and the non-bending area 02 have the first dividing line b1 therebetween parallel to the second direction.

Considering that in a process of bending the touch structure 10 in the second direction, the first touch electrode 101 is subject to greater stress at a position of the first dividing line b1 between the bending area 01 and the non-bending area 02, i.e., at the starting position of bending, and is subject to smaller stress around the first dividing line b1 between the bending area 01 and the non-bending area 02, in the embodiments provided by the present disclosure, among the plurality of first sub-touch electrodes 1011 located in the bending area 01, lengths of first sub-touch electrodes 1011 proximate to the first dividing line b1 between the bending area 01 and the non-bending area 02 are set to be small.

In this way, the lengths of the first sub-touch electrodes 1011 proximate to the first dividing line b1 between the bending area 01 and the non-bending area 02 are small. The smaller the lengths of the first sub-touch electrodes 1011 are, the more favorable it is to release the stress generated by bending, so that the stress at the position of the first dividing line b1 between the bending area 01 and the non-bending area 02 may be effectively released to further avoid the problems such as breakage, peeling off, warpage or crease during bending the first touch electrode 101.

Figure 7:
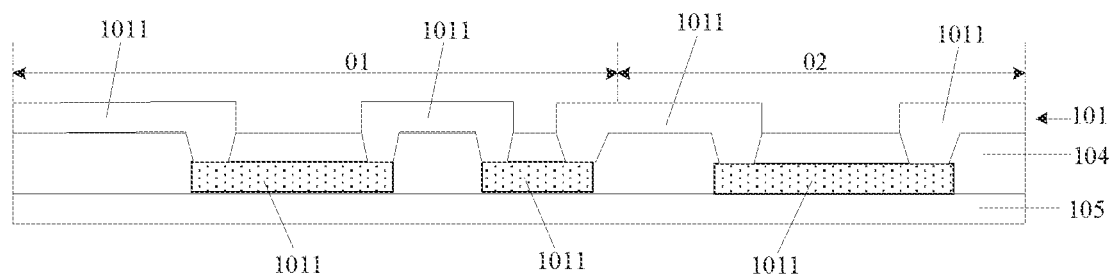
FIG. 7 is a structural diagram of yet another first touch electrode, in accordance with some embodiments of the present disclosure.

For example, as shown in FIG. 7, lengths of the first sub-touch electrodes 1011 located in the bending area 01 gradually decrease in a direction toward the first dividing line b1 between the bending area 01 and the non-bending area 02.

Herein, it can be understood that since the lengths of the first sub-touch electrodes 1011 located in the bending area 01 gradually decrease in the direction toward the first dividing line b1 between the bending area 01 and the non-bending area 02, a distance between adjacent first sub-touch electrodes 1011 located on a same side of the first insulating layer 104 in the bending area 01 gradually decreases in the direction toward the first dividing line b1 between the bending area 01 and the non-bending area 02.

As for the portion of the first touch electrode 101 located in the non-bending area 02:

In a case where the portion of the first touch electrode 101 located in the non-bending area 02 also includes the first sub-touch electrodes 1011, in the direction toward the first dividing line b1 between the bending area 01 and the non-bending area 02, lengths of the first sub-touch electrodes 1011 located in the non-bending area 02 may be the same, or may gradually decrease, or of course, may also gradually increase.

Considering that in the process of bending the touch structure 10 in the second direction, the first touch electrode 101 is also subject to greater stress at a position of the first center line a1 of the bending area 01 (the first dividing line b1 between the bending area 01 and the non-bending area 02 is parallel to the first center line a1 of the bending area 01), and is subject to smaller stress around the first center line a1 of the bending area 01, in embodiments of the present disclosure, among the first sub-touch electrodes 1011 located in the bending area 01, lengths of first sub-touch electrodes 1011 proximate to the first center line a1 of the bending area 01 are set to be small.

In this way, the lengths of the first sub-touch electrodes 1011 proximate to the first center line a1 of the bending area 01 are small. The smaller the lengths of the first sub-touch electrodes 1011 are, the more favorable it is to release the stress generated by bending, so that the stress at the position of the first center line a1 of the bending area 01 may be effectively released to further avoid the problems such as breakage, peeling off, warpage, or crease during bending the first touch electrode 101.

Figure 8:
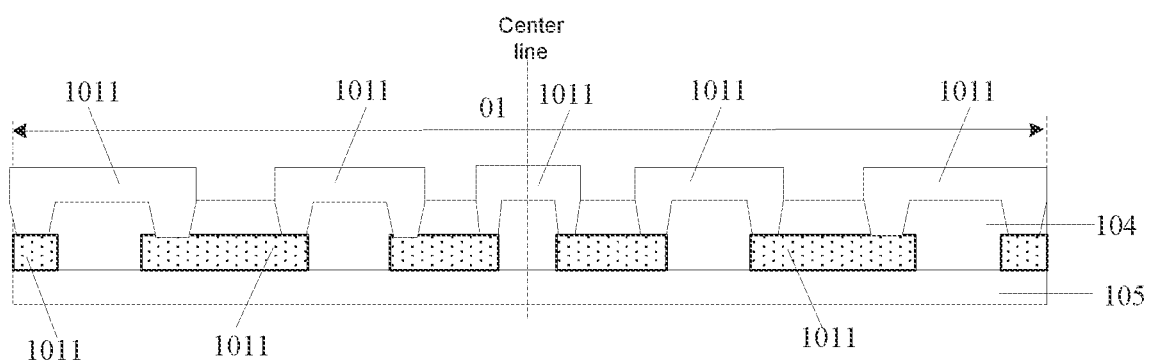
FIG. 8 is a structural diagram of yet another first touch electrode, in accordance with some embodiments of the present disclosure.

For example, as shown in FIG. 8, the lengths of the first sub-touch electrodes 1011 located in the bending area 01 gradually decrease in a direction toward the first center line a1 of the bending area 01.

It will be noted that FIG. 8 only shows the bending area 01, but does not show the non-bending area 02.

Herein, it can be understood that since the lengths of the first sub-touch electrodes 1011 located in the bending area 01 gradually decrease in the direction toward the first center line a1 of the bending area 01, the distance between adjacent first sub-touch electrodes 1011 located on the same side of the first insulating layer 104 in the bending area 01 gradually decreases in the direction toward the first center line a1 of the bending area 01.

Figure 9:
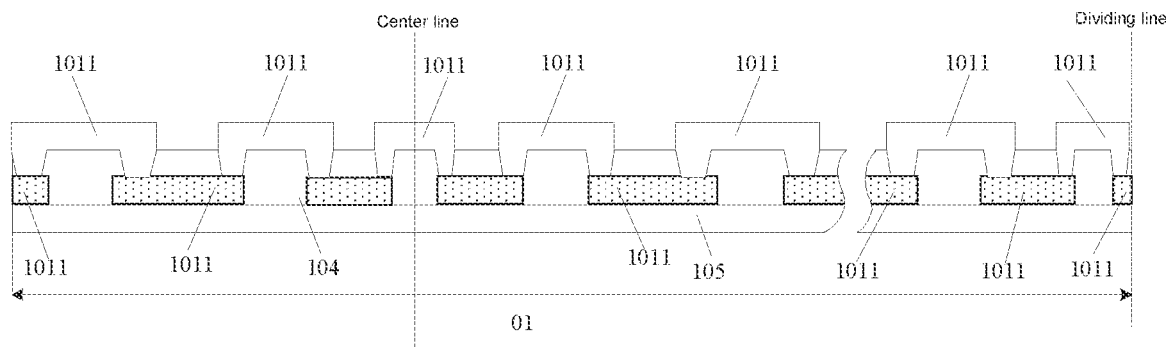
FIG. 9 is a structural diagram of yet another first touch electrode, in accordance with some embodiments of the present disclosure.

Considering that in the process of bending the touch structure 10 in the second direction, stress both at the position of the first dividing line b1 between the bending area 01 and the non-bending area 02 and at the position of the first center line a1 of the bending area 01 is great, in some embodiments, as shown in FIG. 9, in an area defined by the first dividing line b1 between the bending area 01 and the non-bending area 02 and the first center line a1 of the bending area 01, the lengths of the first sub-touch electrodes 1011 gradually decrease from middle to edges in a direction perpendicular to the first center line a1 of the bending area 01. In addition, in an area on a side of the first center line b1 of the bending area 01 away from the first dividing line b1 between the bending area 01 and the non-bending area 02, the lengths of the first sub-touch electrodes 1011 gradually decrease in the direction toward the first center line a1 of the bending area 01.

Herein, since in the area defined by the first dividing line b1 between the bending area 01 and the non-bending area 02 and the first center line a1 of the bending area 01, the lengths of the first sub-touch electrodes 1011 gradually decrease from middle to edges in the direction perpendicular to the first center line a1 of the bending area 01, in the bending area 01 the distance between adjacent first sub-touch electrodes 1011 located on the same side of the first insulating layer 104 gradually decreases from middle to edges in the direction perpendicular to the first center line a1 of the bending area 01. Since in the area on a side of the first center line a1 of the bending area 01 away from the first dividing line b1 between the bending area 01 and the non-bending area 02, the lengths of the first sub-touch electrodes 1011 gradually decrease in the direction toward the first center line a1 of the bending area 01, in the bending area 01, the distance between adjacent first sub-touch electrodes 1011 located on the same side of the first insulating layer 104 gradually decreases in the direction toward the first center line a1 of the bending area 01.

In the area defined by the first dividing line b1 between the bending area 01 and the non-bending area 02 and the first center line a1 of the bending area 01, the lengths of the first sub-touch electrodes 1011 gradually decrease from middle to edges in the direction perpendicular to the first center line a1 of the bending area 01, and in the area on a side of the first center line a1 of the bending area 01 away from the first dividing line b1 between the bending area 01 and the non-bending area 02, the lengths of the first sub-touch electrodes 1011 gradually decrease in the direction toward the first center line a1 of the bending area 01. And the smaller the lengths of the first sub-touch electrodes 1011 are, the more favorable it is to release the stress caused by bending. Therefore, the stress at the position of the first dividing line b1 between the bending area 01 and the non-bending area 02 and at the position of the first center line a1 of the bending area 01 may be released more to further avoid the problems such as breakage, peeling off, warpage, or crease during bending the first touch electrode 101.

As for the portion of the first touch electrode 101 located in the non-bending area 02:

In the case where the portion of the first touch electrode 101 located in the non-bending area 02 also includes the first sub-touch electrodes 1011, in the direction toward the first center line a1 of the bending area 01, lengths of the first sub-touch electrodes 1011 located in the non-bending area 02 may be the same, or may gradually decrease, or of course, may also gradually increase.

In a case where the lengths of the first sub-touch electrodes 1011 in the first touch electrode 101 are too small, the difficulty of the process for manufacturing the first sub-touch electrode 1011 may increase. In a case where the first touch electrode 101 has a certain length, if the length of the first sub-touch electrode 1011 decreases, the number of the first sub-touch electrodes 1011 will increase, and since any two adjacent first sub-touch electrodes 1011 are electrically connected through the via hole 1041 in the first insulating layer 104, the number of via holes will increase. However, in a case where the touch structure 10 is applied to the touch display apparatus, too many via holes 1041 will affect the display effect. In a case where the lengths of the first sub-touch electrodes 1011 in the first touch electrode 101 are too large, the first sub-touch electrodes 1011 will still be prone to the problems such as breakage, peeling off, warpage or crease during the bending of the first sub-touch electrode 1011 in the second direction. Based on these, in some embodiments, the length of the first sub-touch electrode 1011 is in a range from 3 μm to 7500 μm along the first direction.

For example, the length of the first sub-touch electrode 1011 may be 3 μm, 5 μm, 10 μm, 20 μm, 100 μm, 200 μm, 500 μm, 1000 μm, 2000 μm, 5000 μm, 7000 μm or 7500 μm.

The touch structure 10 provided by the embodiments of the present disclosure may be a self-capacitance touch structure or a mutual-capacitance touch structure.

As shown in FIGS. 10a to 21, in a case where the touch structure 10 is a mutual-capacitance touch structure, the touch structure 10 provided by embodiments of the present disclosure further includes a plurality of second touch electrodes 102 extending in the second direction and sequentially arranged in the first direction, and the first touch electrodes 101 and the second touch electrodes 102 are insulated from each other.

It will be noted that, that the second touch electrode 102 extends in the second direction means that the second touch electrode 102 has a tendency to extend in the second direction as a whole.

A shape of the second touch electrode 102 is not limited in the embodiments of the present disclosure. An overall shape of the second touch electrode 102 may be a straight strip or a bent strip. Of course, the second touch electrode 102 may include a plurality of second rhombuses arranged sequentially in the second direction, and adjacent second rhombuses are connected together through a second connecting strip. In a case where the first touch electrode 101 includes the plurality of first rhombuses sequentially arranged in the first direction, and adjacent first rhombuses are connected together through the first connecting strip, and the second touch electrode 102 includes the plurality of second rhombuses sequentially arranged in the second direction, and adjacent second rhombuses are connected together through the second connecting strip, the first connecting strip and the second connecting strip cross, projections of the first rhombus on the substrate 105 and a projection of the second touch electrode 102 on the substrate 105 do not have an overlapping region, and projections of the second rhombus on the substrate 105 and a projection of the first touch electrode 101 on the substrate 105 do not have an overlapping region.

It will be noted that, figures in the embodiments of the present disclosure are illustrated by taking the first touch electrode 101 and the second touch electrode 102 are both straight strips as an example.

In the embodiments of the present disclosure, the first touch electrode 101 is a driving electrode and the second touch electrode 102 is a sensing electrode. Or, the first touch electrode 101 is a sensing electrode and the second touch electrode 102 is a driving electrode.

A principle that the touch structure 10 realizes mutual-capacitance touch is as follows: a capacitor is formed at a position where the first touch electrode 101 and the second touch electrode 102 cross, that is, the first touch electrode 101 and the second touch electrode 102 respectively constitute electrodes of the capacitor at the crossed position. When a finger touches the touch structure, a coupling between the first touch electrode 101 and the second touch electrode 102 near a touch point is affected, thereby changing a capacitance between the first touch electrode 101 and the second touch electrode 102. When a magnitude of a mutual capacitance value is detected, the plurality of first touch electrodes 101 extending in the first direction sequentially send excitation signals, and all second touch electrodes 102 extending in the second direction receive signals simultaneously, so that capacitances at the crossed positions of all the first touch electrodes 101 and all the second touch electrodes 102 may be obtained. According to data of variation amount of the capacitances at the crossed positions of all the first touch electrodes 101 and all the second touch electrodes 102, coordinates of each touch point may be calculated.

In the case where the touch structure 10 is applied to the touch display apparatus, in some embodiments, the touch display apparatus needs to have a function of bending in the first direction (i.e., the bending line is parallel to the first direction) in addition to having a function of bending in the second direction (i.e., the bending line is parallel to the second direction). Based on this, as shown in (b) of FIG. 3, in some embodiments, the touch structure 10 has one bending area 01 and four non-bending areas 02. The bending area 01 includes two parts, one part extends in the second direction, the other part extends in the first direction, and the first direction and the second direction intersect with each other, e.g., are perpendicular to each other. That is, the two parts of the bending area 01 cross. In other words, the bending area 01 has a cross-shaped structure. The area other than the bending area 01 of the touch structure 10 is divided into four areas, and the four non-bending areas 02 are disposed in the four areas, respectively. Based on this, it will be known from the foregoing that the bending area 01 has a second center line a2 parallel to the first direction.

With reference to (b) of FIG. 3 and FIG. 10a or FIGS. 9 and 11a, it can be understood that in a case where the touch structure 10 is bent along the first direction in the bending area 01 (i.e., the bending line is parallel to the first direction), since the second touch electrode 102 extends in the second direction, and an extension direction of the second touch electrode 102 is perpendicular to a direction in which stress is applied during bending the second touch electrode 102, the second touch electrode 102 is prone to the problems such as breakage, peeling off, warpage or crease. That is, in a case where the touch structure 10 needs to have the function of bending in the first direction, the second touch electrode 102 may also affect the bending resistance of the touch structure 10.

Based on this, as shown in FIGS. 10a to 11b, in some embodiments, at least a portion of the second touch electrode 102 located in the bending area 01 includes a plurality of second sub-touch electrodes 1021 arranged in or substantially in the second direction.

Figure 10A:
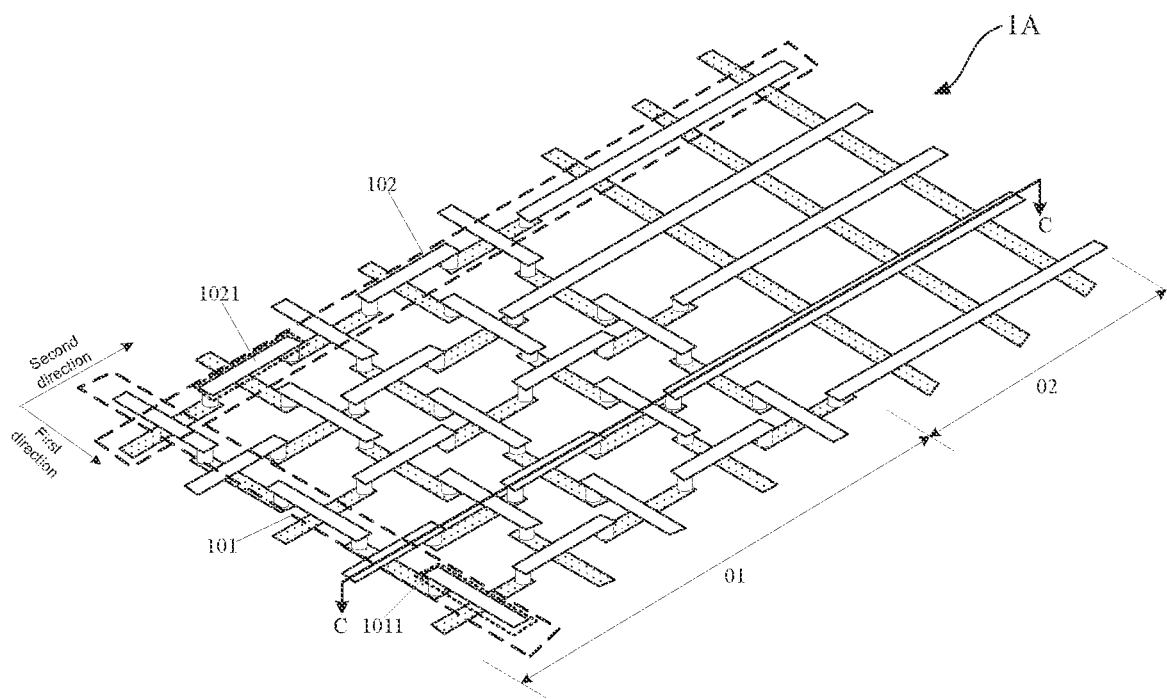
FIG. 10a is a layout diagram of part 1A in (b) of FIG. 3.
Figure 10B:
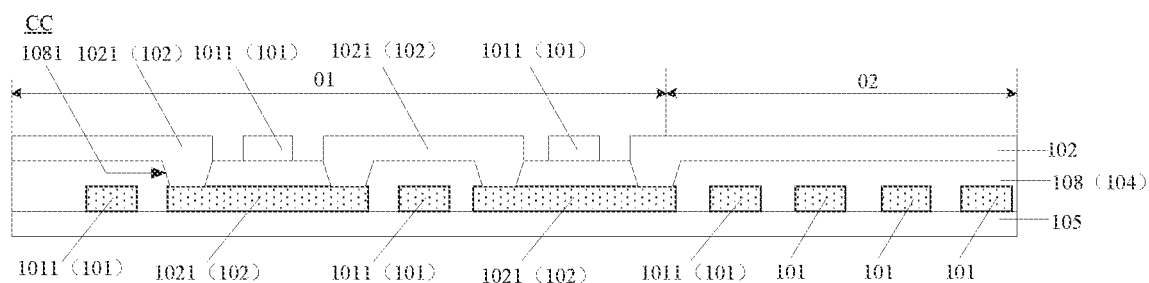

For example, as shown in FIG. 10b, the touch structure 10 further includes a second insulating layer 108.

Herein, a material of the second insulating layer 108 is not limited, for example, it may be one or more of SiOx, SiNx and SiNxOy. The second insulating layer 108 and the first insulating layer 104 may be made of a same material or different materials.

With continued reference to FIG. 10b, the second insulating layer 108 has a plurality of via holes 1081. As shown in FIGS. 10a and 10b, among the plurality of second sub-touch electrodes 1021 of the second touch electrode 102, any two adjacent second sub-touch electrodes 1021 are located on two opposite sides of the second insulating layer 108, and any two adjacent second sub-touch electrodes 1021 are electrically connected through at least one via hole 1081 in the second insulating layer 108.

In this way, in a case where the touch structure 10 is bent along the first direction in the bending area 01 (i.e., the bending line is parallel to the first direction), since the plurality of second sub-touch electrodes 1021 are alternately arranged on and below the second insulating layer 108 at least in the bending area 01, part of stress may be released to reduce the stress impact caused by bending. In this way, the problems such as breakage, peeling off, warpage or crease caused by excessive stress or stress concentration after the second touch electrode 102 is repeatedly bent may be avoided, which improves the bending resistance of the touch structure 10.

Further, in a case where the touch structure 10 is bent in the bending area 01 along a direction intersecting with both the first direction and the second direction, since at least in the bending area 01, the plurality of first sub-touch electrodes 1011 are alternately arranged on and below the first insulating layer 104, and the plurality of second sub-touch electrodes 1021 are alternately arranged on and below the second insulating layer 108, part of stress may be released to reduce the stress impact caused by bending. In this way, the problems such as breakage, peeling off, warpage or crease caused by excessive stress or stress concentration after the first touch electrode 101 and the second touch electrode 102 are repeatedly bent may be avoided, which improves the bending resistance of the touch structure 10.

For example, as shown in FIGS. 10a and 10b, the plurality of second sub-touch electrodes 1021 of the second touch electrode 102 are alternately located on two opposite sides of the second insulating layer 108 in the second direction.

An arrangement of a portion of the second touch electrode 102 located in the non-bending area 02 includes but is not limited to the following two manners.

I. As shown in FIGS. 10a and 10b, the portion of the second touch electrode 102 located in the non-bending area 02 extends continuously in the second direction, and the portion of the second touch electrode 102 located in the non-bending area 02 is located on a same side of the second insulating layer. That is, only the portion of the second touch electrode 102 located in the bending area 01 includes the second sub-touch electrodes 1021, whereas the portion of the second touch electrode 102 located in the non-bending area 02 is entire.

Figure 11A:
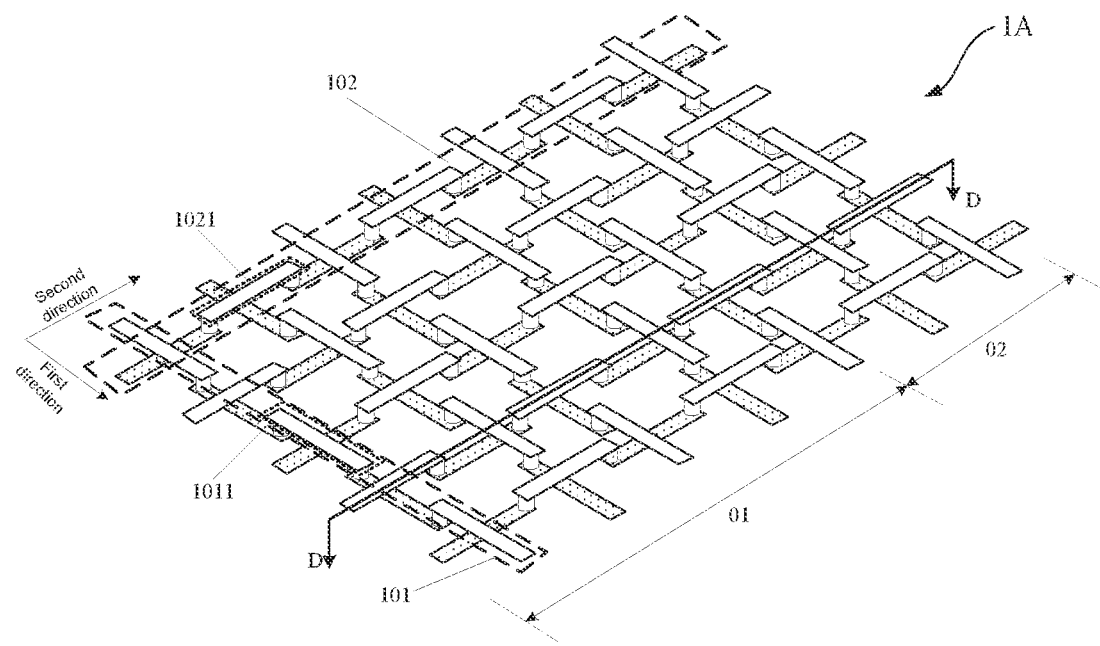
FIG. 11a is another layout diagram of part 1A in (b) of FIG. 3.
Figure 11B:
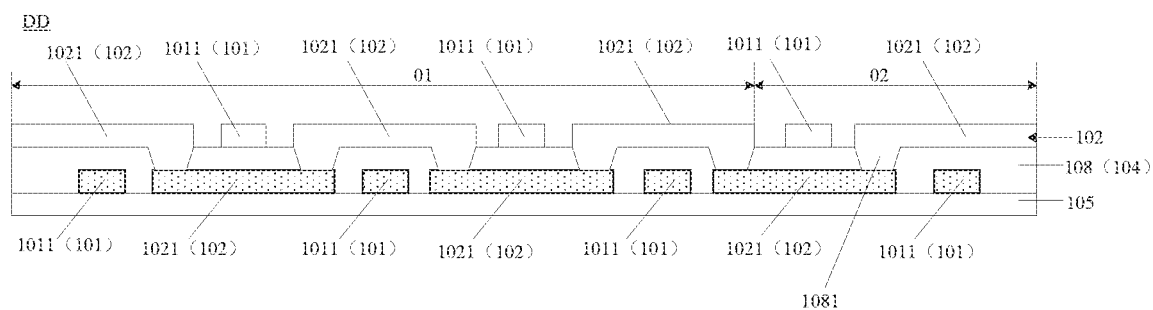

II. As shown in FIGS. 11a and 11b, the portion of the second touch electrode 102 located in the non-bending area 02 includes a plurality of second sub-touch electrodes 1021. In the second direction, among the plurality of second sub-touch electrodes 1021 of the second touch electrode 102 located in the non-bending area 02, any two adjacent second sub-touch electrodes 1021 are located on two opposite sides of the second insulating layer 108, and any two adjacent second sub-touch electrodes 1021 are electrically connected through at least one via hole in the second insulating layer. That is, the portion of the second touch electrode 102 located in the bending area 01 and the portion of the second touch electrode 102 located in the non-bending area 02 both include second sub-touch electrodes 1021.

It will be noted that in the above embodiments, in the second direction, two adjacent second sub-touch electrodes 1021 located on two opposite sides of the second insulating layer 108 may be made of a same material or different materials.

In embodiments of the present disclosure, lengths of the second sub-touch electrodes 1021 included in the second touch electrode 102 may be the same or different.

For example, as shown in FIGS. 10a and 10b, in a case where only the portion of the second touch electrode 102 located in the bending area 01 includes the second sub-touch electrodes 1021, the lengths of the second sub-touch electrodes 1021 located in the bending area 01 are the same. Or, in the case where only the portion of the second touch electrode 102 located in the bending area 01 includes the second sub-touch electrodes 1021, the lengths of the second sub-touch electrodes 1021 located in the bending area 01 are different.

For example, as shown in FIGS. 11a and 11b, in a case where the portions of the second touch electrode 102 located in the bending area 01 and the non-bending area 02 both include the second sub-touch electrodes 1021, the lengths of the second sub-touch electrodes 1021 included in each second touch electrode 102 are the same. Or, in the case where the portions of the second touch electrode 102 located in the bending area 01 and the non-bending area 02 both include the second sub-touch electrodes 1021, the lengths of the second sub-touch electrodes included in each second touch electrode 102 are different.

As shown in (b) of FIG. 3, in some embodiments, the bending area 01 and the non-bending area 02 have the second dividing line b2 therebetween parallel to the first direction.

Considering that in a process of bending the touch structure 10 in the first direction, the second touch electrode 102 is subject to greater stress at a position of the second dividing line b2 between the bending area 01 and the non-bending area 02, i.e., at the starting position of bending in the first direction, and is subject to smaller stress around the second dividing line b2 between the bending area 01 and the non-bending area 02, in embodiments of the present disclosure, among the second sub-touch electrodes 1021 located in the bending area 01 lengths of second sub-touch electrodes 1021 proximate to the second dividing line b2 between the bending area 01 and the non-bending area 02 are set to be small.

In this way, the lengths of the second sub-touch electrodes 1021 proximate to the second dividing line b2 between the bending area 01 and the non-bending area 02 are small. And the smaller the lengths of the second sub-touch electrodes 1021 are, the more favorable it is to release the stress generated by bending, so that the stress at the position of the second dividing line b2 between the bending area 01 and the non-bending area 02 may be effectively released to further avoid the problems such as breakage, peeling off, warpage or crease during bending the second touch electrode 102.

Figure 12:
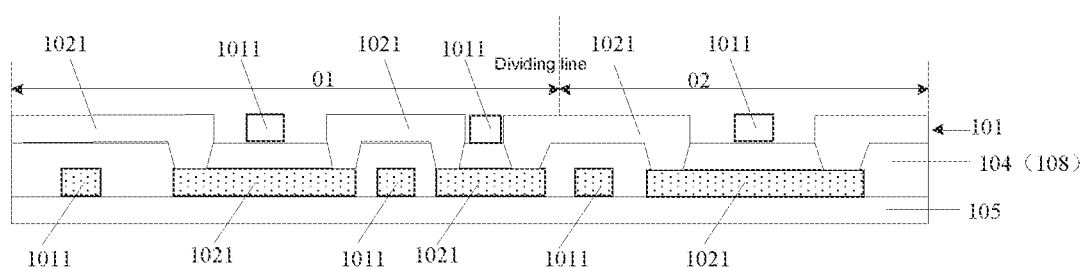
FIG. 12 is a structural diagram of yet another touch structure, in accordance with some embodiments of the present disclosure.

For example, as shown in FIG. 12, the lengths of the second sub-touch electrodes 1021 located in the bending area 01 gradually decrease in a direction toward the second dividing line b2 between the bending area 01 and the non-bending area 02.

Herein, it can be understood that since the lengths of the second sub-touch electrodes 1021 located in the bending area 01 gradually decrease in the direction toward the second dividing line b2 between the bending area 01 and the non-bending area 02, a distance between adjacent second sub-touch electrodes 1021 located on a same side of the second insulating layer 108 in the bending area 01 gradually decreases in the direction toward the second dividing line b2 between the bending area 01 and the non-bending area 02.

As for the portion of the second touch electrode 102 located in the non-bending area 02:

In a case where the portion of the second touch electrode 102 located in the non-bending area 02 also includes the second sub-touch electrodes 1021, along the direction toward the second dividing line b2 between the bending area 01 and the non-bending area 02, lengths of the second sub-touch electrodes 1021 located in the non-bending area 02 may be the same, or may gradually decrease, or of course, may also gradually increase.

Considering that in the process of bending the touch structure 10 in the first direction, the second touch electrode 102 is also subject to greater stress at a position of the second center line a2 of the bending area 01 (the second dividing line a2 between the bending area 01 and the non-bending area 02 is parallel to the second center line a2 of the bending area 01), and is subject to smaller stress around the second center line a2 of the bending area 01, in embodiments of the present disclosure, among the second sub-touch electrodes 1021 located in the bending area 01, lengths of second sub-touch electrodes 1021 proximate to the second center line a2 of the bending area 01 are set to be small. In this way, the lengths of the second sub-touch electrodes 1021 proximate to the second center line a2 of the bending area 01 are small, and the smaller the lengths of the second sub-touch electrodes 1021 are, the more favorable it is to release the stress generated by bending, so that the stress at the position of the second center line a2 of the bending area 01 may be effectively released to further avoid the problems such as breakage, peeling off, warpage or crease during bending the second touch electrode 102.

Figure 13:
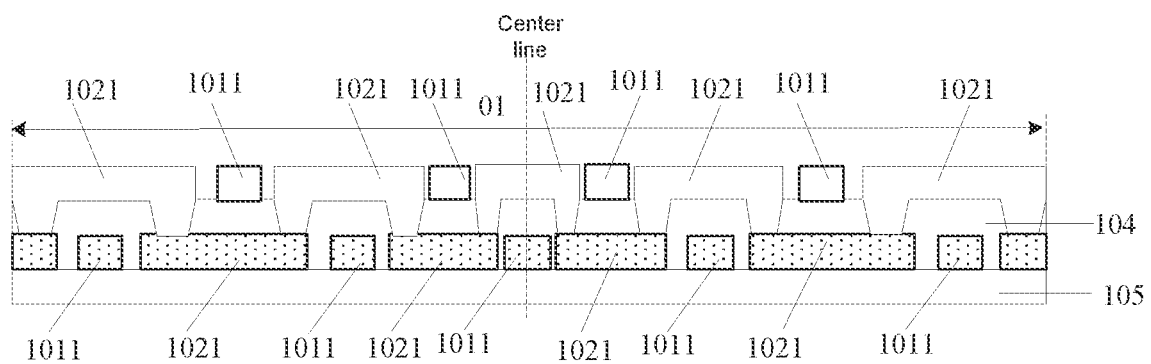
FIG. 13 is a structural diagram of yet another touch structure, in accordance with some embodiments of the present disclosure.
Figure 14:
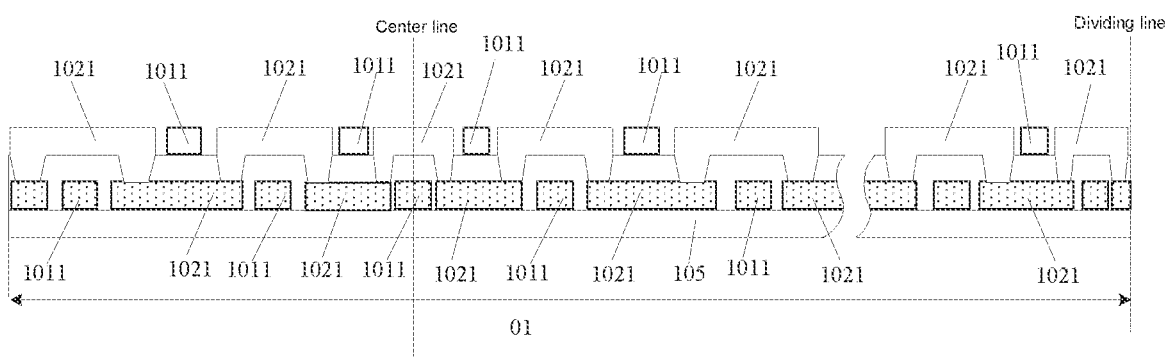
FIG. 14 is a structural diagram of yet another touch structure, in accordance with some embodiments of the present disclosure.

For example, as shown in FIG. 13, the lengths of the second sub-touch electrodes 1021 located in the bending area 01 gradually decrease along a direction toward the second center line a2 of the bending area 01.

It will be noted that FIG. 13 only shows the bending area 01, but does not show the non-bending area 02.

Herein, it can be understood that since the lengths of the second sub-touch electrodes 1021 located in the bending area 01 gradually decrease along the direction toward the second center line a2 of the bending area 01, a distance between adjacent second sub-touch electrodes 1021 located on a same side of the second insulating layer 108 in bending area 01 gradually decreases along the direction toward the second center line a2 of the bending area 01.

As for the portion of the second touch electrode 102 located in the non-bending area 02:

In the case where the portion of the second touch electrode 102 located in the non-bending area 02 also includes the second sub-touch electrodes 1021, along the direction toward the second center line a2 of the bending area 01, the lengths of the second sub-touch electrodes 1021 located in the non-bending area 02 may be the same, or may gradually decrease, or of course, may also gradually increase.

In some embodiments, there is a second dividing line parallel to the first direction between the bending area and the non-bending area. In some examples, in an area defined by the second dividing line and the second center line, lengths of second sub-touch electrodes gradually decrease from middle to edges in a direction perpendicular to the second center line. In some other examples, in an area on a side of the second center line away from the second dividing line, lengths of second sub-touch electrodes gradually decrease in a direction toward the second center line.

In a case where the lengths of the second sub-touch electrodes 1021 in the second touch electrode 102 are too small, the difficulty of the process for manufacturing the second sub-touch electrode 1021 may increase. In a case where the second touch electrode 102 has a certain distance, if the length of the second sub-touch electrode 1021 decreases, the number of the second sub-touch electrodes 1021 will increase, and since adjacent second sub-touch electrodes 1021 are electrically connected through the via hole 1081 in the second insulating layer, the number of via holes provided will increase. However, in a case where the touch structure 10 is applied to the touch display apparatus, too many via holes will affect the display effect. In a case where the lengths of the second sub-touch electrodes 1021 in the second touch electrode 102 are too large, the second sub-touch electrodes 1021 will still be prone to the problems such as breakage, peeling off, warpage or crease during bending the second sub-touch electrode 1021 in the first direction. Based on these, in some embodiments, the length of the second sub-touch electrode 1021 is in a range from 3 μm to 7500 μm in the first direction.

For example, the length of the second sub-touch electrode 1021 may be 3 μm, 5 μm, 10 μm, 20 μm, 100 μm, 200 μm, 500 μm, 1000 μm, 2000 μm, 5000 μm, 7000 μm or 7500 μm.

In the embodiments of the present disclosure, the distance between two adjacent second sub-touch electrodes 1021 in the second touch electrode 102 is not limited. The distance between two adjacent second sub-touch electrodes 1021 in the second touch electrode 102 may be the same or different.

Figure 15:
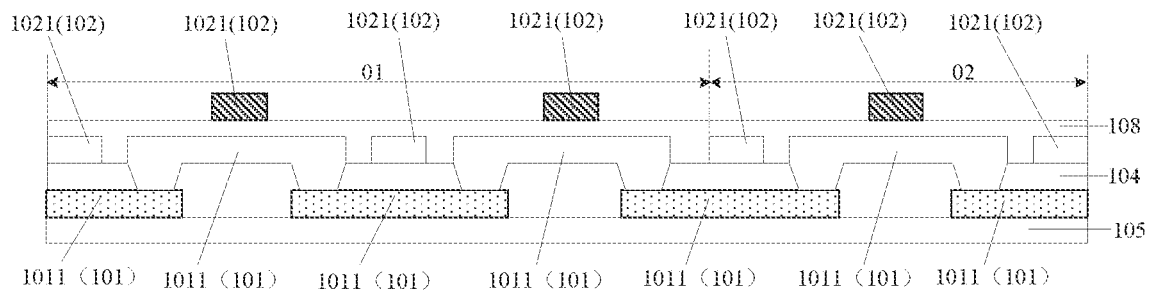
FIG. 15 is a structural diagram of yet another touch structure, in accordance with some embodiments of the present disclosure.
Figure 16:
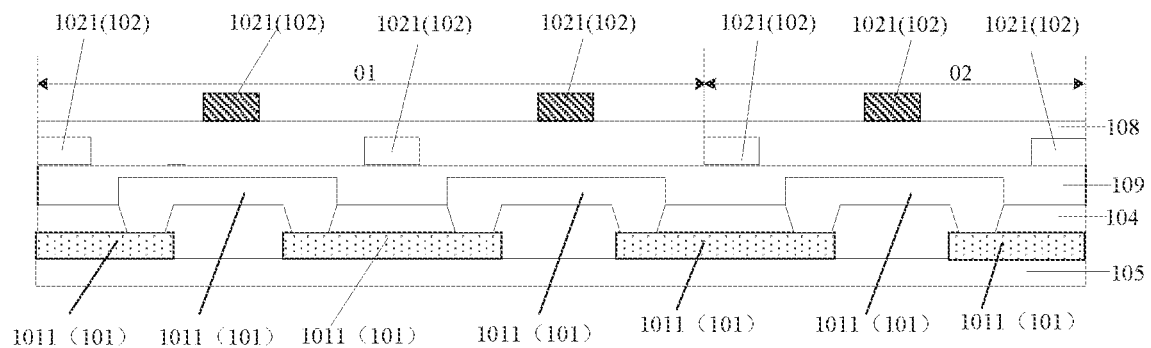
FIG. 16 is a structural diagram of yet another touch structure, in accordance with some embodiments of the present disclosure.

In embodiments of the present disclosure, as shown in FIGS. 10b and 11b, the first insulating layer 104 and the second insulating layer 108 may be a same layer; or as shown in FIGS. 15 and 16, the first insulating layer 104 and the second insulating layer 108 are sequentially arranged.

In a case where the first insulating layer 104 and the second insulating layer 108 are the same layer, the first sub-touch electrodes 1011 and the second sub-touch electrodes 1021 that are located on the same side of the first insulating layer 104 (or the second insulating layer 108) are disposed in a same layer. The first sub-touch electrodes 1011 and the second sub-touch electrodes 1021 that are located on the same side of the first insulating layer 104 (or the second insulating layer 108) may be made of a same material or different materials.

For example, as shown in FIGS. 10a and 10b, and FIGS. 11a and 11b, the first sub-touch electrodes 1011 and the second sub-touch electrodes 1021 that are located on the same side of the first insulating layer 104 are made of a same material and disposed in a same layer. In this way, the first sub-touch electrode 1011 and the second sub-touch electrode 1021 that are located on the same side of the first insulating layer 104 may be manufactured simultaneously, thereby simplifying a manufacturing process of the touch structure 10.

It will be noted that, as shown in FIGS. 10a and 10b, or FIGS. 11a and 11b, in order to avoid conduction between the first touch electrode 101 and the second touch electrode 102, the first sub-touch electrode 1011 and the second sub-touch electrode 1021 that cross are located on two opposite sides of the first insulating layer 104, and two adjacent second sub-touch electrodes 1021 are located on two opposite sides of the first insulating layer 104 in the first direction and the second direction.

It will also be noted that, simultaneously manufacturing the first sub-touch electrode 1011 and the second sub-touch electrode 1021 that are located on the same side of the first insulating layer 104 means that after a conductive film is formed, the conductive film is patterned through a single patterning process (the patterning process includes processes of photoresist coating, mask exposure, development and etching), so that the first sub-touch electrode 1011 and the second sub-touch electrode 1021 are formed simultaneously.

In a case where the first insulating layer 104 and the second insulating layer are sequentially arranged, the first sub-touch electrodes 1011 and the second sub-touch electrodes 1021 that are located between the first insulating layer 104 and the second insulating layer 108 may be disposed in a same layer or different layers. The first sub-touch electrodes 1011 and the second sub-touch electrodes 1021 that are located between the first insulating layer 104 and the second insulating layer 108 may be made of a same material or different materials.

For example, as shown in FIG. 15, first sub-touch electrodes 1011 and second sub-touch electrodes 1021 that are located between the first insulating layer 104 and the second insulating layer 108 are made of a same material and disposed in a same layer. Therefore, the first sub-touch electrodes 1011 and the second sub-touch electrodes 1021 that are located between the first insulating layer 104 and the second insulating layer 108 may be formed simultaneously, thereby simplifying the manufacturing process of the touch structure 10.

It will be noted that, as shown in FIG. 15, in order to avoid conduction between the first touch electrode 101 and the second touch electrode 102, the first sub-touch electrode 1011 and the second sub-touch electrode 1021 that cross are located on two opposite sides of the first insulating layer 104 or the second insulating layer 108.

It will also be noted that, a process for simultaneously forming the first sub-touch electrodes 1011 and the second sub-touch electrodes 1021 that are located between the first insulating layer 104 and the second insulating layer 108 is the same as a process for simultaneously forming the first sub-touch electrode 1011 and the second sub-touch electrode 1021 that are located on the same side of the first insulating layer 104, which have been described above and will not be repeated herein.

For example, as shown in FIG. 16, in the case where the first insulating layer 104 and the second insulating layer 108 are sequentially arranged, the touch structure 10 further includes a third insulating layer 109 disposed between the first insulating layer 104 and the second insulating layer 108. The first sub-touch electrodes 1011 and the second sub-touch electrodes 1021 that are located between the first insulating layer 104 and the second insulating layer 108 are located on two opposite sides of the third insulating layer. That is, the first touch electrodes 101 and the second touch electrodes 102 are located on two opposite sides of the third insulating layer.

It will be noted that, in the case where the first insulating layer 104 and the second insulating layer 108 are sequentially arranged, the first insulating layer 104 is closer to the substrate 105 than the second insulating layer 108, or the second insulating layer 108 is closer to the substrate 105 than the first insulating layer 104. FIGS. 15 and 16 are illustrated by taking an example in which the first insulating layer 104 is closer to the substrate 105 than the second insulating layer 108.

Figure 17A:
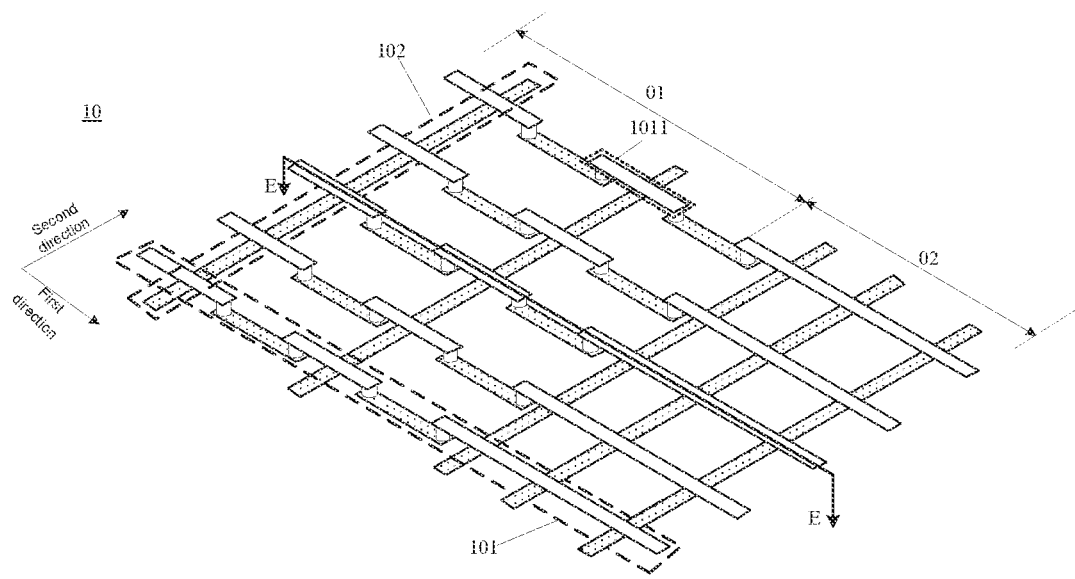
FIG. 17a is a structural diagram of yet another touch structure, in accordance with some embodiments of the present disclosure.

Referring to FIGS. 17a and 18a, it can be understood that in a case where the touch structure 10 is bent along the second direction in the bending area 01 (i.e., the bending line is parallel to the second direction), since the second touch electrode 102 extends in the second direction, and the extension direction of the second touch electrode 102 is parallel to the direction in which stress is applied during bending the second touch electrode 102, the second touch electrode 102 will not be prone to the problems such as breakage, peeling off, warpage or crease. Based on this, in a case where the touch structure 10 only have the function of bending in the second direction, the second touch electrode 102 will not affect the bending resistance of the touch structure 10.

Based on this, as shown in FIGS. 17a and 18a, in some embodiments, the second touch electrode 102 continuously extends in the second direction.

In some examples, as shown in FIG. 17a, the second touch electrode 102 continuously extends in the second direction, and the plurality of second touch electrodes 102 are located on a same side of the first insulating layer 104.

Figure 17B:
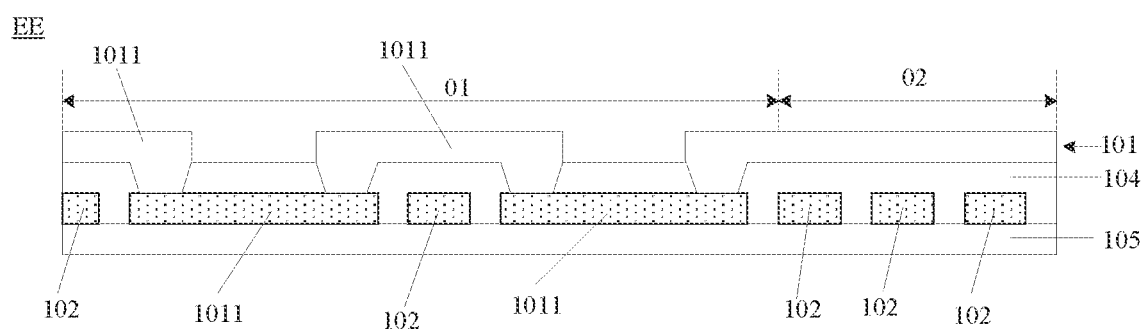

For example, as shown in FIGS. 17a and 17b, the first sub-touch electrodes 1011 located on one side of the first insulating layer 104 and the plurality of second touch electrodes 102 are disposed in a same layer and made of a same material. FIG. 17a is illustrated by taking an example in which the first sub-touch electrodes 1011 located on a side of the first insulating layer 104 proximate to the substrate 105 (not shown in FIG. 17a) and the plurality of second touch electrodes 102 are disposed in a same layer and made of a same material.

Figure 18:
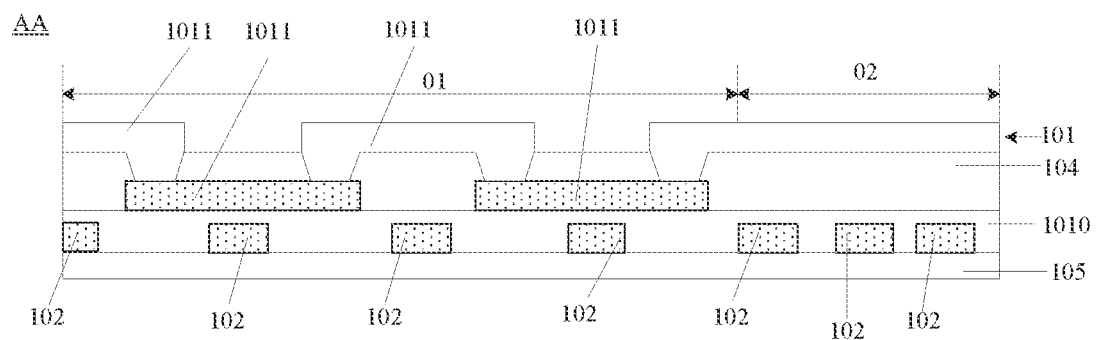
FIG. 18 is a structural diagram of yet another touch structure, in accordance with some embodiments of the present disclosure.

For example, as shown in FIG. 18, the plurality of second touch electrodes 102 are disposed at a side of the plurality of first touch electrodes 101. In this way, a fourth insulating layer 1010 is provided between the plurality of first touch electrodes 101 and the plurality of second touch electrodes 102.

Figure 19A:
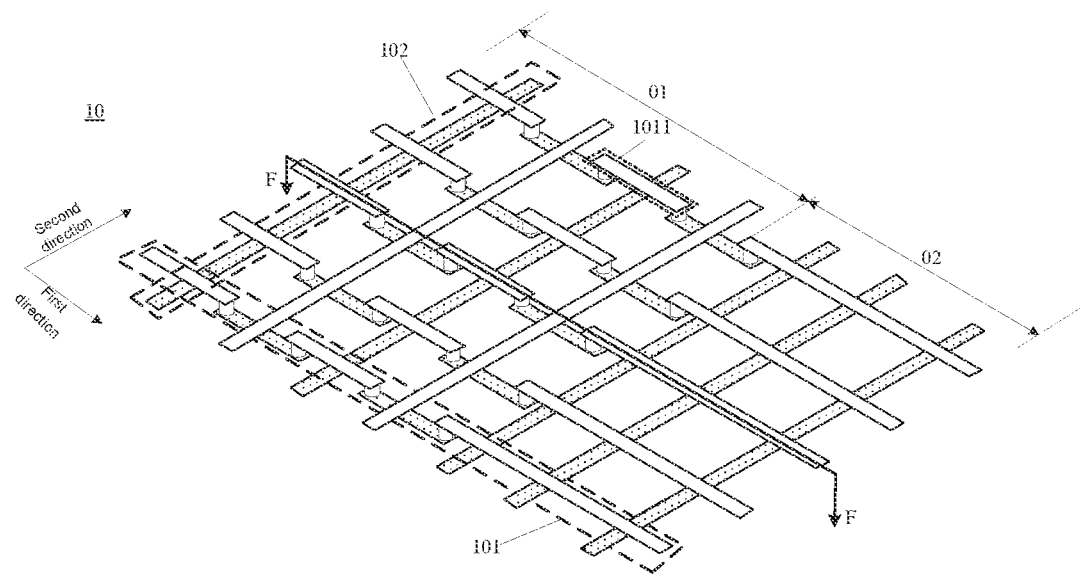
FIG. 19a is a structural diagram of yet another touch structure, in accordance with some embodiments of the present disclosure.
Figure 19B:
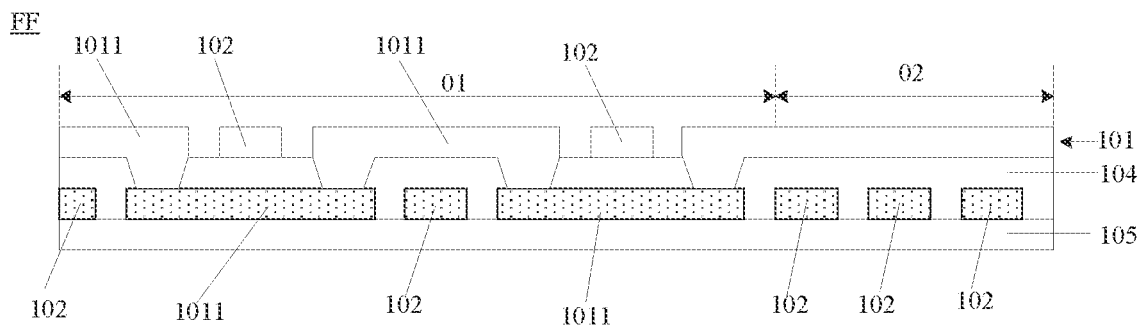

In some examples, as shown in FIGS. 19a and 19b, the second touch electrode 102 continuously extends along the second direction, and the plurality of second touch electrodes 102 are located on two opposite sides of the first insulating layer 104.

For example, the first sub-touch electrodes 1011 and the second touch electrodes 102 that are located on the same side of the first insulating layer 104 are disposed in a same layer and made of a same material. That is, among the plurality of second touch electrodes 102, the second touch electrodes 102 located on a side of the first insulating layer 104 away from the substrate 105 are disposed in a same layer and made of a same material as the first sub-touch electrodes 1011 located on a side of the first insulating layer 104 away from the substrate 105; and among the plurality of second touch electrodes 102, the second touch electrodes 102 located on a side of the first insulating layer 104 proximate to the substrate 105 are disposed in a same layer and made of a same material as the first sub-touch electrodes 1011 located on a side of the first insulating layer 104 proximate to the substrate 105.

Figure 20:
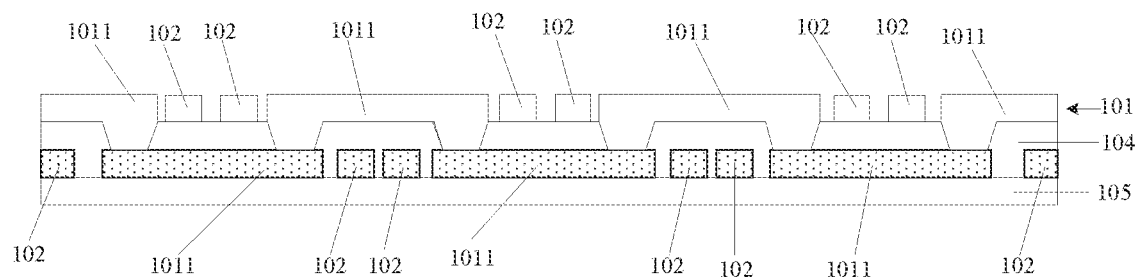
FIG. 20 is a structural diagram of yet another touch structure, in accordance with some embodiments of the present disclosure.

In any of the above embodiments, as shown in FIGS. 11a to 19b, the first sub-touch electrode 1011 may only cross over one second touch electrode 102; or as shown in FIG. 20, the first sub-touch electrode 1011 may cross over two or more second touch electrodes 102 (FIG. 20 takes the first sub-touch electrode 1011 crossing over two second touch electrodes 102 as an example for illustration). Correspondingly, in the case where the second touch electrode 102 includes the second sub-touch electrodes 1021, the second sub-touch electrode 1021 may only cross over one first touch electrode 101; or the second sub-touch electrode 1021 may cross over two or more first touch electrodes 101.

Figure 21:
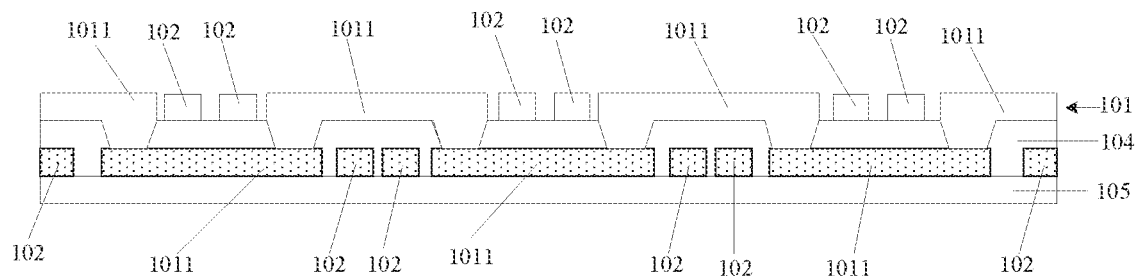
FIG. 21 is a structural diagram of yet another ouch structure, in accordance with some embodiments of the present disclosure.

In some embodiments, as shown in FIG. 21, the touch structure 10 further includes a protective layer 106 disposed on a side of the first touch electrode 101 and the second touch electrode 102 away from the substrate 105.

For example, the protective layer may be made of one or more of silicon oxide, silicon nitride and silicon oxynitride.

Hereinafter, the manufacturing process of the touch structure 10 will be described in detail by taking an example in which the first insulating layer 104 and the second insulating layer 108 are disposed in a same layer and made of a same material.

Figure 22A:
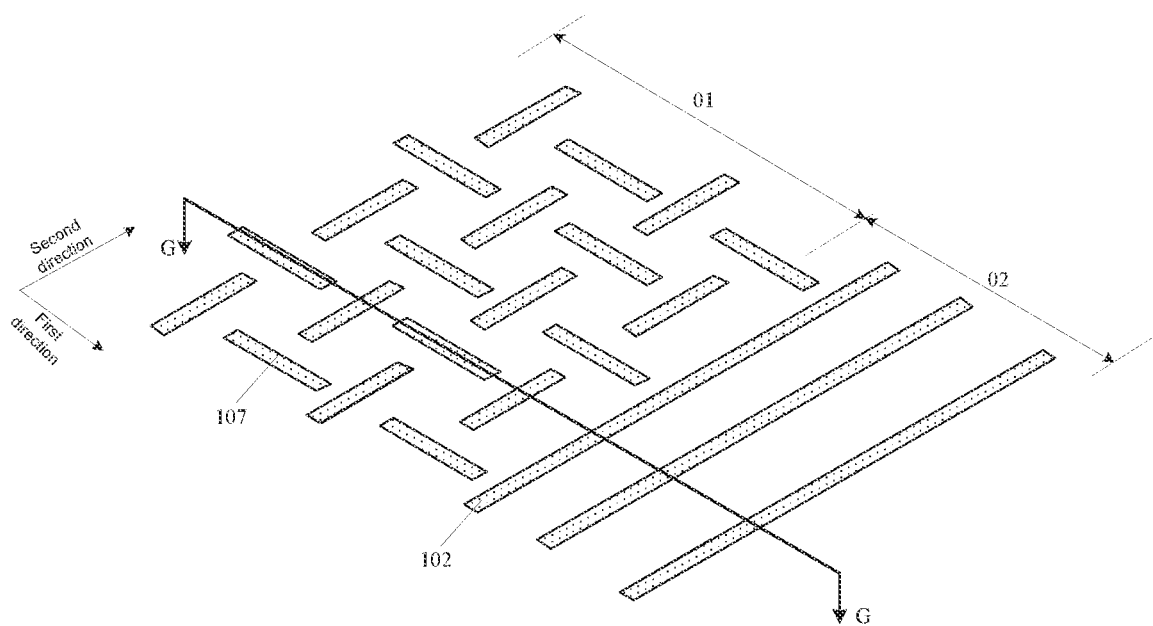
FIG. 22a is a structural diagram of a first conductive layer formed on a substrate, in accordance with some embodiments of the present disclosure.
Figure 22B:
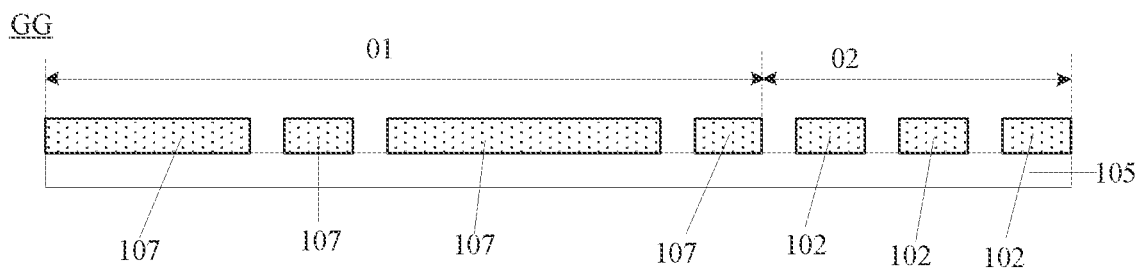

In S100, a first conductive film is firstly formed on the substrate 105, and then as shown in FIGS. 22a and 22b, a patterning process is performed on the first conductive film to form a first conductive layer. At least a portion of the first conductive layer located in the bending area 01 includes a plurality of first conductive strips 107 arranged in a matrix, each line of the first conductive strips 107 arranged in the first direction extend alternately in the first direction and the second direction, and each line of the first conductive strips 107 arranged in the second direction extend alternately in the first direction and the second direction.

Figure 23:
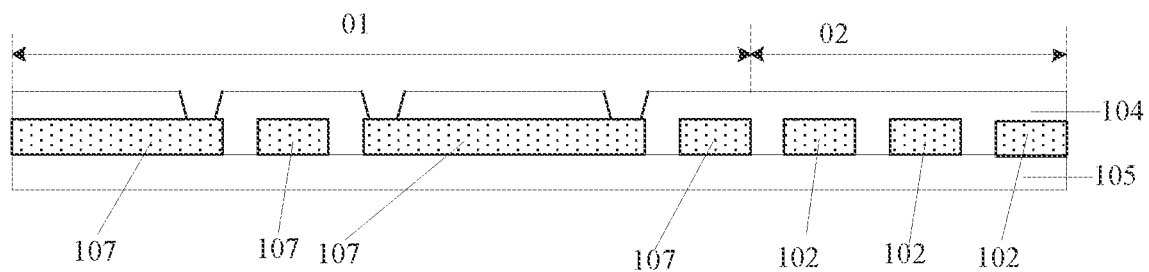
FIG. 23 is a structural diagram of a first insulating layer formed on the first conductive layer, in accordance with some embodiments of the present disclosure.

In S101, as shown in FIG. 23, the first insulating layer 104 is formed on the first conductive layer, and via holes are formed in the first insulating layer 104 to expose two ends of each first conductive strip 107.

In S102, a second conductive layer is formed on the first insulating layer 104. At least a portion of the second conductive layer located in the bending area 01 includes a plurality of second conductive strips arranged in a matrix, each line of the second conductive strips arranged in the first direction extend alternately in the first direction and the second direction, each line of the second conductive strips arranged in the second direction extend alternately in the first direction and the second direction, and one first conductive strip and one second conductive strip cross. The line of second conductive strips extending in the first direction pass through the via holes in the first insulating layer 104 and are electrically connected to the first conductive strips adjacent to the second conductive strips and extending in the first direction, to form the first touch electrodes 101; one first conductive strip 107 or one second conductive strip is one first sub-touch electrode 1011 of the first touch electrode 101. The line of second conductive strips extending in the second direction pass through the via holes in the first insulating layer 104 and are electrically connected to the first conductive strips adjacent to the second conductive strips and extending in the second direction, to form the second touch electrodes 102; one first conductive strip 107 or one second conductive strip is one second sub-touch electrode 1021 of the second touch electrode 102.

In some embodiments, after 3102, as shown in FIG. 21 the protective layer 106 is formed on the second conductive layer.

Based on the above, in a case where the first touch electrode 101 includes the first sub-touch electrodes 1011 in both the bending area 01 and the non-bending area 02, and the second touch electrode 102 includes the second sub-touch electrodes 1021 in both the bending area 01 and the non-bending area 02, portions of both the first touch electrode 101 and the second touch electrode 102 located in the non-bending area 02 are also formed synchronously with portions of both the first touch electrode 101 and the second touch electrode 102 located in the bending area 01 by the method of S100 to S102. In a case where the portions of both the first touch electrode 101 and the second touch electrode 102 located in the non-bending area 02 continuously extend, in S100, the first conductive layer further includes second touch electrodes 102 located in the non-bending area 02 and extending continuously in the second direction, and in S102, a portion of the second conductive strip located in the non-bending area 02 extends continuously in the first direction.

The forgoing descriptions are merely specific implementation manners of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A touch structure, having a bending area and a non-bending area, the touch structure comprising:
a plurality of first touch electrodes extending in a first direction and sequentially arranged in a second direction, at least a portion of a first touch electrode located in the bending area including first sub-touch electrodes arranged in the first direction; the first direction intersecting with the second direction; the bending area having a first center line parallel to the second direction and a second center line parallel to the first direction;
a first insulating layer having a plurality of via holes; among the first sub-touch electrodes of the first touch electrode, any two adjacent first sub-touch electrodes being located on two opposite sides of the first insulating layer, and any two adjacent first sub-touch electrodes being electrically connected through at least one via hole in the first insulating layer;
a plurality of second touch electrodes extending in the second direction and sequentially arranged in the first direction, at least a portion of a second touch electrode located in the bending area including second sub-touch electrodes arranged in the second direction; and the first touch electrodes and the second touch electrodes being insulated from each other; and
a second insulating layer having a plurality of via holes; among the second sub-touch electrodes of the second touch electrode, any two adjacent second sub-touch electrodes being located on two opposite sides of the second insulating layer, and any two adjacent second sub-touch electrodes being electrically connected through at least one via hole in the second insulating layer.

2. The touch structure according to claim 1, wherein a portion of the first touch electrode located in the non-bending area includes first sub-touch electrodes; and
in the first direction, among the first sub-touch electrodes located in the non-bending area of the first touch electrode, any two adjacent first sub-touch electrodes are located on two opposite sides of the first insulating layer, and any two adjacent first sub-touch electrodes are electrically connected through at least one via hole in the first insulating layer.

3. The touch structure according to claim 1, wherein a portion of the first touch electrode located in the non-bending area extends continuously in the first direction, and portions of the plurality of first touch electrodes located in the non-bending area are disposed on a same side of the first insulating layer.

4. The touch structure according to claim 1, wherein the bending area and the non-bending area have a first dividing line therebetween parallel to the second direction;
lengths of the first sub-touch electrodes located in the bending area gradually decrease in a direction toward the first dividing line; or
the lengths of the first sub-touch electrodes located in the bending area gradually decrease in a direction toward the first center line.

5. The touch structure according to claim 1, wherein the bending area and the non-bending area have a first dividing line therebetween parallel to the second direction;
in an area defined by the first dividing line and the first center line, lengths of first sub-touch electrodes gradually decrease from middle to edges in a direction perpendicular to the first center line; and/or
in an area on a side of the first center line away from the first dividing line, lengths of first sub-touch electrodes gradually decrease in a direction toward the first center line.

6. The touch structure according to claim 1, wherein lengths of the first sub-touch electrodes are in a range from 3 μm to 7500 μm in the first direction.

7. The touch structure according to claim 1, wherein a portion of the second touch electrode located in the non-bending area includes second sub-touch electrodes; and
in the second direction, among the second sub-touch electrodes located in the non-bending area of the second touch electrode, any two adjacent second sub-touch electrodes are located on two opposite sides of the second insulating layer, and any two adjacent second sub-touch electrodes are electrically connected through at least one via hole in the second insulating layer.

8. The touch structure according to claim 1, wherein a portion of the second touch electrode located in the non-bending area extends continuously in the second direction, and portions of the plurality of second touch electrodes located in the non-bending area are disposed on a same side of the second insulating layer.

9. The touch structure according to claim 1, wherein the bending area and the non-bending area have a second dividing line therebetween parallel to the first direction;
lengths of the second sub-touch electrodes located in the bending area gradually decrease in a direction toward the second dividing line; or
the lengths of the second sub-touch electrodes located in the bending area gradually decrease in a direction toward the second center line.

10. The touch structure according to claim 1, wherein the bending area and the non-bending area have a second dividing line therebetween parallel to the first direction;
in an area defined by the second dividing line and the second center line, lengths of second sub-touch electrodes gradually decrease from middle to edges in a direction perpendicular to the second center line; and/or
in an area on a side of the second center line away from the second dividing line, lengths of second sub-touch electrodes gradually decrease in a direction toward the second center line.

11. The touch structure according to claim 1, wherein lengths of the second sub-touch electrodes are in a range from 3 μm to 7500 μm in the second direction.

12. The touch structure according to claim 1, wherein the first insulating layer and the second insulating layer are a same layer.

13. The touch structure according to claim 12, wherein first sub-touch electrodes and second sub-touch electrodes that are located on a same side of the first insulating layer are made of a same material and disposed in a same layer.

14. The touch structure according to claim 1, wherein the first insulating layer and the second insulating layer are sequentially arranged.

15. The touch structure according to claim 14, wherein first sub-touch electrodes and second sub-touch electrodes that are located between the first insulating layer and the second insulating layer are made of a same material and disposed in a same layer; or
the touch structure further comprises a third insulating layer disposed between the first insulating layer and the second insulating layer; the plurality of first touch electrodes and the plurality of second touch electrodes are located on two opposite sides of the third insulating layer.

16. The touch structure according to claim 1, wherein the second touch electrode extends continuously in the second direction; and
the plurality of second touch electrodes are disposed on a same side of the first insulating layer, or, the plurality of second touch electrodes are disposed on two opposite sides of the first insulating layer.

17. A touch substrate, comprising a substrate and the touch structure according to claim 1, the touch structure being disposed on the substrate.

18. A touch display apparatus, comprising:
a display panel; and
the touch structure according to claim 1, the touch structure being disposed inside or on a side of the display panel.

* * * * *